(12) United States Patent
Nishio et al.

(10) Patent No.: US 6,522,550 B1
(45) Date of Patent: Feb. 18, 2003

(54) ELECTRONIC DEVICE

(75) Inventors: Atsushi Nishio, Mito (JP); Katsuhiro Hori, Mito (JP); Satoru Karahashi, Mito (JP); Yoshiyuki Kikuchi, Mito (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/617,403

(22) Filed: Jul. 17, 2000

(30) Foreign Application Priority Data

Jul. 27, 1999 (JP) .............................. 11-212095

(51) Int. Cl.⁷ .............................. H05K 5/00; H05K 5/04; H05K 5/06
(52) U.S. Cl. ........................ 361/752; 361/683; 361/753; 361/790
(58) Field of Search ................................. 361/727–732, 361/735, 752, 753, 790, 796, 683; 235/439–441, 483–486; 312/223.1, 223.2

(56) References Cited

U.S. PATENT DOCUMENTS

| | | | | |
|---|---|---|---|---|
| 4,931,909 A | * | 6/1990 | Backes | 361/686 |
| 5,169,218 A | * | 12/1992 | Chu | 312/223.2 |
| 5,321,580 A | * | 6/1994 | Hosoi et al. | 361/684 |
| 5,677,830 A | * | 10/1997 | Nogas et al. | 361/790 |
| 5,823,828 A | * | 10/1998 | Bricaud et al. | 439/630 |
| 5,831,256 A | * | 11/1998 | De Larminat et al. | 235/486 |
| 5,841,630 A | * | 11/1998 | Seto et al. | 361/683 |
| 5,841,639 A | * | 11/1998 | Scnoor et al. | 361/796 |
| 6,226,189 B1 | * | 5/2001 | Haffenden et al. | 235/492 |
| 6,434,011 B1 | * | 8/2002 | Jenkins et al. | 312/223.2 |

* cited by examiner

*Primary Examiner*—David L. Talbott
*Assistant Examiner*—Tuan Dinh
(74) *Attorney, Agent, or Firm*—Ladas & Parry

(57) ABSTRACT

An electronic device having a terminal unit disposed within a window formed on the casing is provided. This terminal unit is protected from an inadvertent touch. The electronic device of the present invention includes the casing and the terminal unit that is formed on a substrate disposed in the casing and has one or more terminals exposed through the window formed on the surface of the casing. This electronic device further includes a cover to block up the window. The cover is detachably mounted to the window.

5 Claims, 24 Drawing Sheets

ELECTRONIC DEVICE

BACKGROUND OF THE INVENTION

1. Field of the Invention

The present invention relates generally to electronic devices such as USB-type connecting devices for connecting various USB-type interface equipments, and, more particularly, to a structure of a contact point unit exposed through the surface of the casing of a USB-type connecting device.

2. Description of the Related Art

In recent years, Universal Serial Bus (USB)-type interfaces (hereinafter referred to as "USB interfaces") have been employed as common interfaces for connecting various peripheral equipments, such as keyboard, mouse, and printer, to a personal computer, for instance.

In order to connect a plurality of USB interface peripheral equipments to a personal computer, a USB hub provided with a plurality of USB interface connectors is used.

In a USB interface, a cable made up of two signal lines and two power lines is used, so that power can be supplied to the peripheral equipments from each USB port via the USB hub.

FIG. 1 is a schematic view of the structure of a USB hub 1.

The USB hub 1 comprises a casing 2, a first USB port 3 formed by a USB connector disposed on the casing 2, second USB ports 4 formed by a plurality (four in FIG. 1) of USB connectors disposed on the casing 2, and a USB hub circuit 5 installed in the casing 2. The first USB port 3 is connected to the host of the USB hub circuit 5, and of the second USB ports 4 is connected to the lower layer side of the USB hub circuit 5.

As shown in FIG. 2, a personal computer is connected to the first USB port 3, while a keyboard 6, a mouse 7, a printer 8, and a scanner 9, each of which is suitable for USB connection, are connected to the second USB ports 4.

With this structure, the keyboard 6, the mouse 7, the printer 8, and the scanner 9 can be used through the personal computer via the USB hub 1.

Furthermore, the USB hub 1 has a layer structure. For instance, a 6-layer USB hub enables the use of 127 peripheral equipments. Also, such a layer-structured USB hub can be connected by hot-line connection (i.e., hot plugs). Thus, the usefulness of a personal computer can be increased further.

However, the USB hub 1 has disadvantages in that peripheral equipments are connected to the USB hub 1 via cables, and that the USB hub 1 is connected to a personal computer via a cable. Accordingly, a plurality of cables are required for the USB hub 1, and a large enough space for accommodating the cables is needed. Also, the arrangement of the cables becomes complicated.

To eliminate the above disadvantages, the USB hub 1 can be provided with a terminal unit exposed through the surface of the casing 2, so that the USB hub 1 can be connected to peripheral equipments without cables. However, if a person inadvertently touches such an exposed terminal unit with a finger, the terminal unit easily corrodes due to the fat of the finger, or the finger generates static electricity, resulting in a breakdown of the peripheral equipments.

SUMMARY OF THE INVENTION

Accordingly, it is an object of the present invention to provide an electronic device comprising:

a casing having a substrate disposed therein and a window formed on a surface thereof;

a terminal unit that is formed on the substrate, and comprises one or more terminals exposed through the window; and a cover that is detachably mounted to the window, and covers and protects the window.

With the above electronic device, no one can inadvertently touch the terminals of the terminal unit. Thus, the terminals can be prevented from corroding due to the fat of a finger, and peripheral equipments connected to the electronic device can be prevented from breaking down due to static electric generated by a finger.

In the electronic device of the present invention, the cover is provided with ribs formed by slits on both sides, and the window is provided with tongues protruding inwardly from both sides. When the cover is attached to the window, the ribs are engaged with the tongues so that the cover is secured to the window.

With this structure, the cover is guided along the window to a predetermined closing position. Thus, the cover can be easily mounted to the window.

In the electronic device of the present invention, each of the ribs is slightly shorter than each corresponding side of the window, and each of the tongues is provided with a stopper protrusion on the top end. When the cover is attached to the window, the stopper protrusions are engaged with gaps between the peripheries of the respective ribs and the periphery of the window, so that the cover is secured to the window.

With this structure, the stopper protrusions are engaged with the gaps between the peripheries of the ribs and the periphery of the window. Thus, the cover can be secured in the predetermined closing position.

In the electronic device of the present invention, a frame for separating the terminals from each other is disposed between the terminals. The frame is collectively formed with the casing.

With this structure, the terminals are protected by the frame even when the cover is not attached to the window. Thus, the terminals can be protected from an inadvertent touch.

Other objects, features and advantages of the present invention will become more apparent from the following detailed description when read in conjunction with the accompanying drawings.

DESCRIPTION OF THE PREFERRED EMBODIMENTS

The following is a description of embodiments of the present invention, with reference to the accompanying drawings.

FIG. 3 and FIGS. 4A to 4D illustrate a USB-type connecting system in which USB-type connecting devices are combined.

Figure 1:
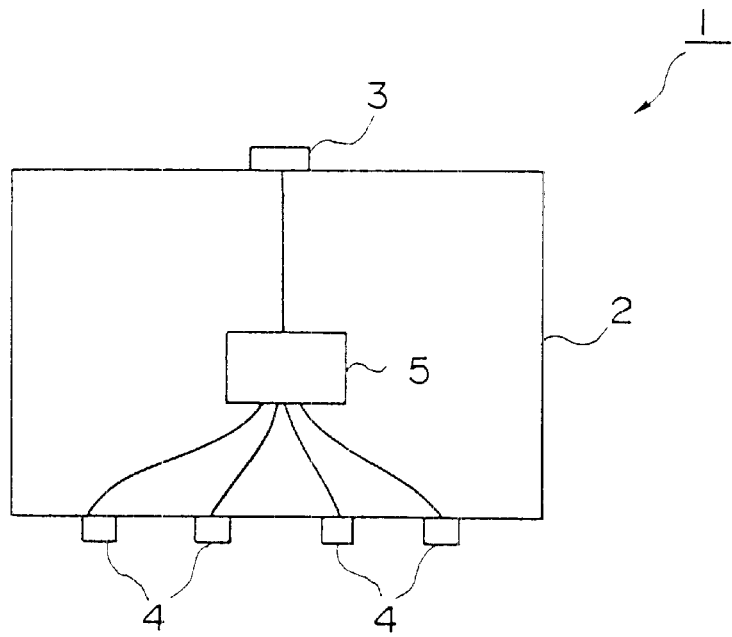
FIG. 1 is a schematic view showing an example of a conventional USB hub.
Figure 2:
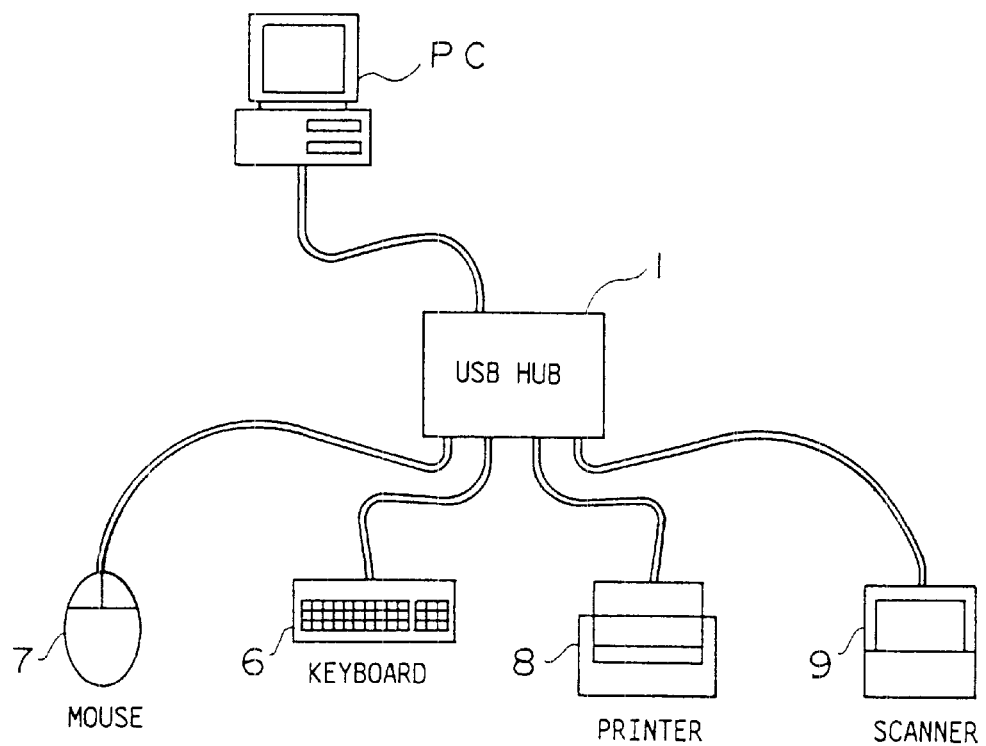
FIG. 2 is a schematic view showing the USB hub of FIG. 1 in practical use.
Figure 3:
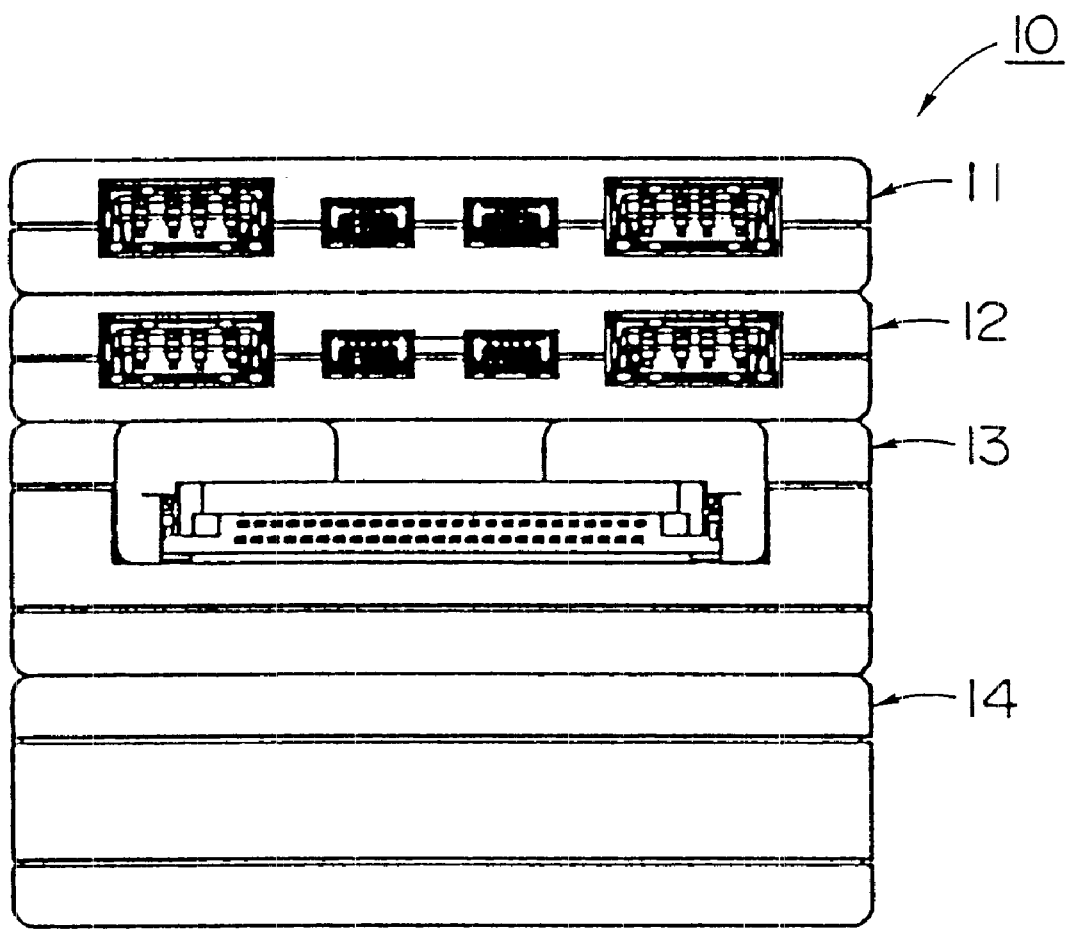
FIG. 3 is a schematic front view of a USB-type connecting system comprising USB-type connecting devices each provided with a contact point unit of the present invention.
Figure 4A:
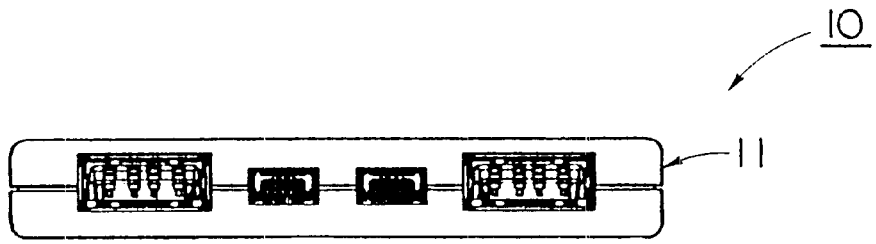
FIGS. 4A to 4D are schematic front views of the USB connecting devices in the USB-type connecting system of FIG. 3.
Figure 4B:
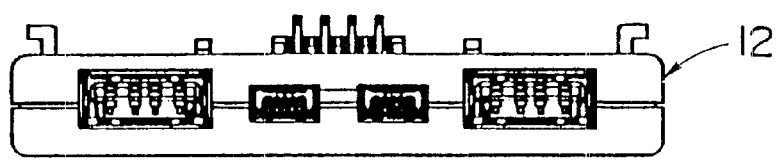
Figure 4C:
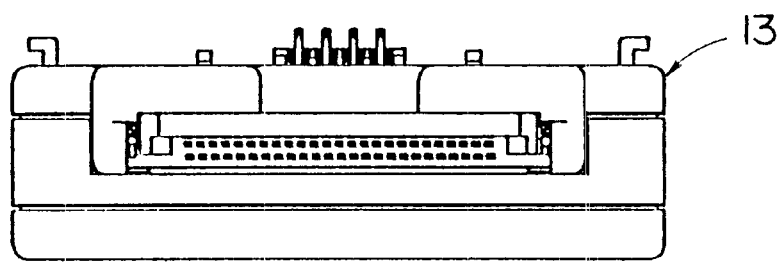
Figure 4D:
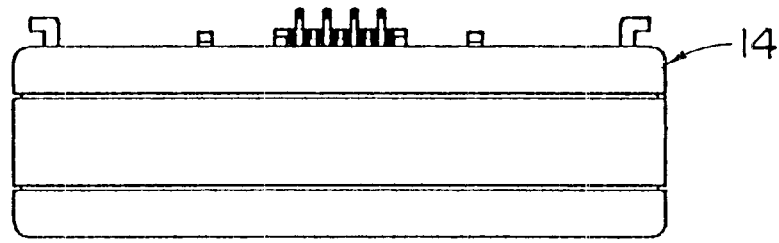

In FIG. 3, a USB-type connecting system 10 comprises USB-type connecting devices 11, 12, 13, and 14.

The USB-type connecting device 11 serves as a main USB hub, and is to be connected to a host computer via a USB cable.

The USB-type connecting device 12 is an option USB hub to be connected to the main USB hub.

The USB-type connecting device 13 is a compact flash card reader as an auxiliary memory unit.

The USB-type connecting device 14 is a power source unit which accommodates a power supply battery for USB interfaces.

The USB-type connecting devices 12, 13, and 14 each have a contact point unit 20 on the upper surface.

Figure 5A:
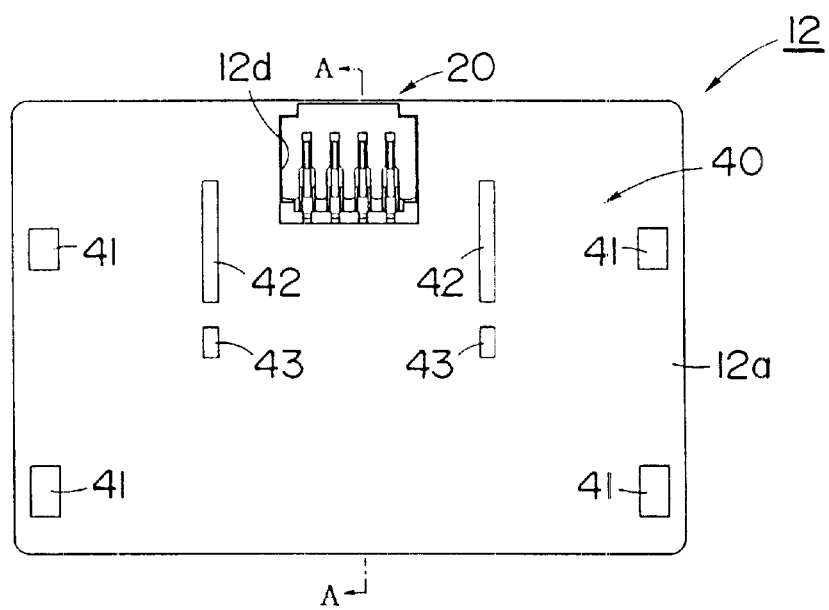
FIG. 5A is a plan view of a USB-type connecting device having a first structure included in the USB-type connecting system of FIG. 3.
Figure 5B:
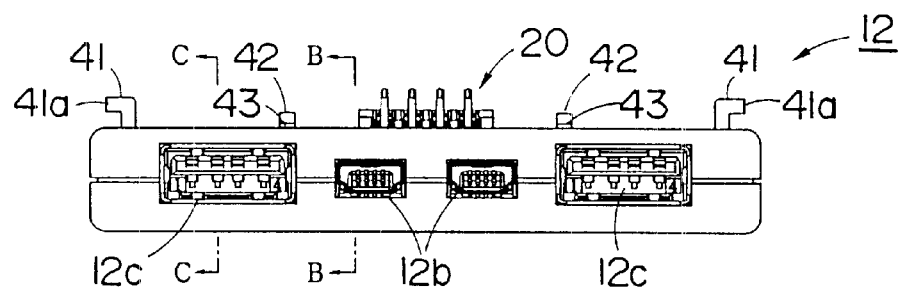
FIG. 5B is a front view of the USB-type connecting device of FIG. 5A.
Figure 5C:
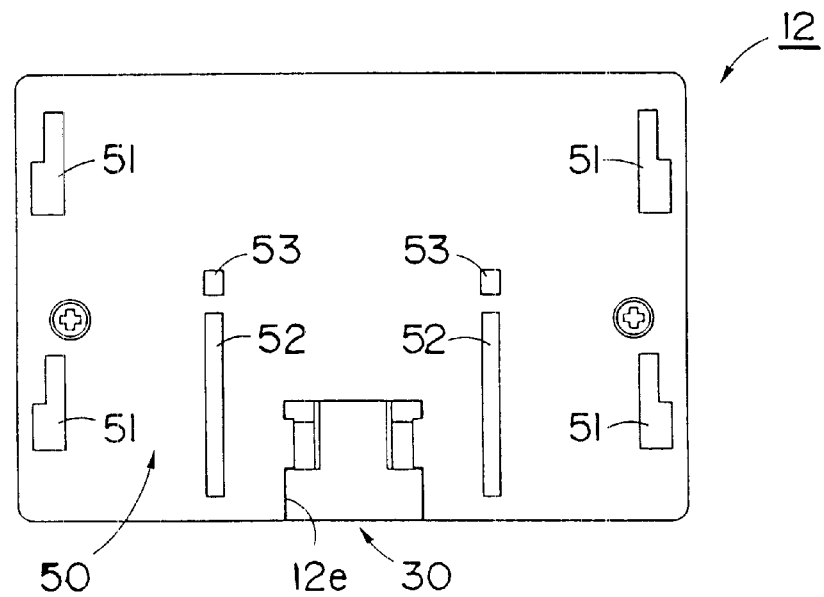
FIG. 5C is a bottom view of the USB-type connecting device of FIG. 5A.
Figure 6A:
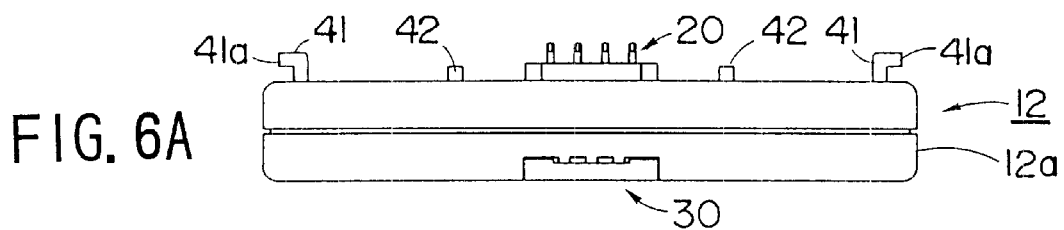
FIG. 6A is a rear view of the USB-type connecting device of FIG. 5A.
Figure 6B:
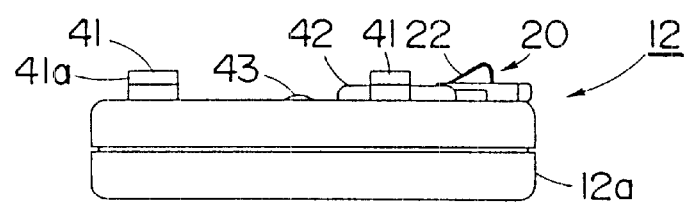
FIG. 6B is a front view of the USB-type connecting device of FIG. 5A.
Figure 6C:
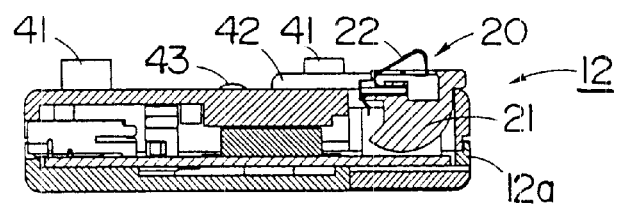
FIG. 6C is a sectional view of the USB-type connecting device taken along the line A—A of FIG. 5A.
Figure 6D:
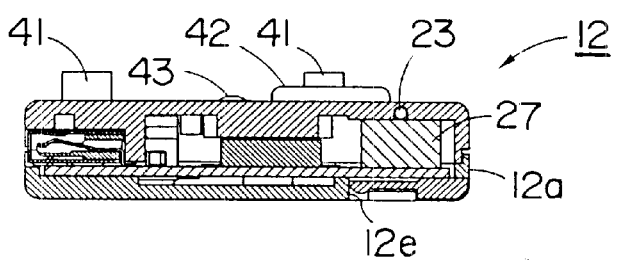
FIG. 6D is a sectional view of the USB-type connecting device take along the line B—B of FIG. 5B.
Figure 6E:
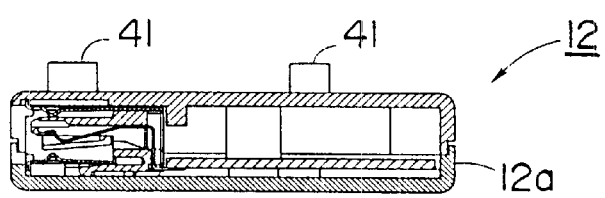
FIG. 6E is a sectional view of the USB-type connecting device taken along the line C—C of FIG. 5B.

The USB-type connecting devices 11, 12, and 13 each have a terminal unit 30 on the lower surface (see FIG. 5C).

First, the USB-type connecting device 12 provided with the contact point unit 20 and the terminal unit 30 will be described in detail.

As shown in FIGS. 5A to 5C and 6A to 6E, the USB-type connecting device 12 serves as a USB hub, and comprises a flat rectangular parallelepiped casing 12a, the contact point unit 20 disposed on the upper surface of the casing 12a, and the terminal unit 30 disposed on the lower surface of the casing 12a.

The contact point unit 20, as the USB port of the upper layers, is connected to a chip-like USB hub circuit mounted on a substrate (not shown) provided in the device 12.

Two different types of USB ports 12b and 12c are disposed on the front side surface of the casing 12a. The USB ports 12b and 12c, and the terminal unit 30 serve as the USB port of the lower layers, and are connected to the USB hub circuit.

The USB-type connecting device 12 is also provided with joining portions 40 and 50 on the upper surface and the lower surface of the casing 12a for positioning and fixing with other USB connecting devices.

Figure 7A:
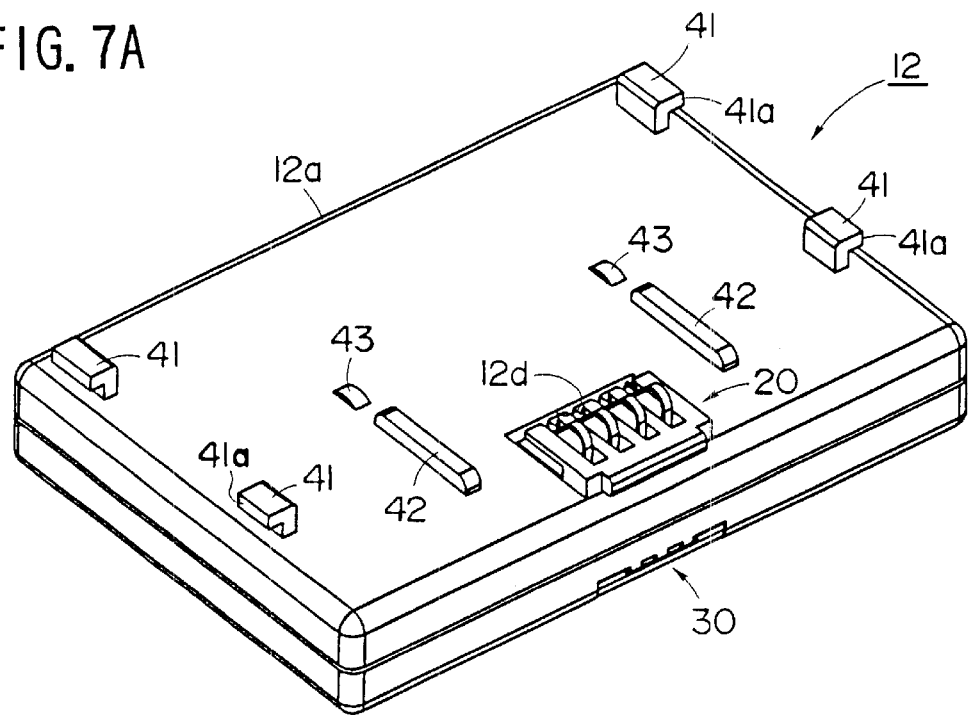
FIG. 7A is a perspective view of the USB-type connecting device of FIG. 5A.
Figure 7B:
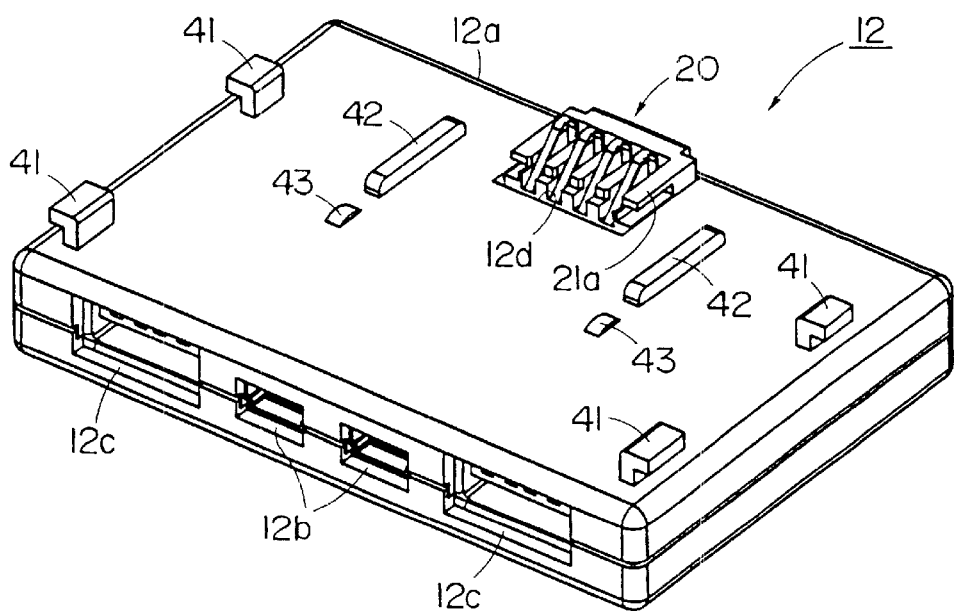
FIG. 7B is a perspective view of the USB-type connecting device of FIG. 5A.

As shown in FIGS. 5A, 7A, and 7B, the joining portion 40 is situated on the upper surface of the casing 12a, and comprises two pairs of hooks 41 that are engaging protrusions formed on both end regions, a pair of guide protrusions 42 formed on both sides of the contact point unit 20, and a pair of positioning protrusions 43 formed on the lines extending from the guide protrusions 42.

The hooks 41 protrude upward and have hook claws 41a extending outward. Thus, each of the hooks has a reverse L-shape, and is integrally molded with casing 12a.

The guide protrusions 42 extend in parallel with each other on the upper surface of the casing 12a, and are also integrally molded with the casing 12a.

The positioning protrusions 43 are semicircles extending backward and forward, and protruding only slightly.

Figure 8A:
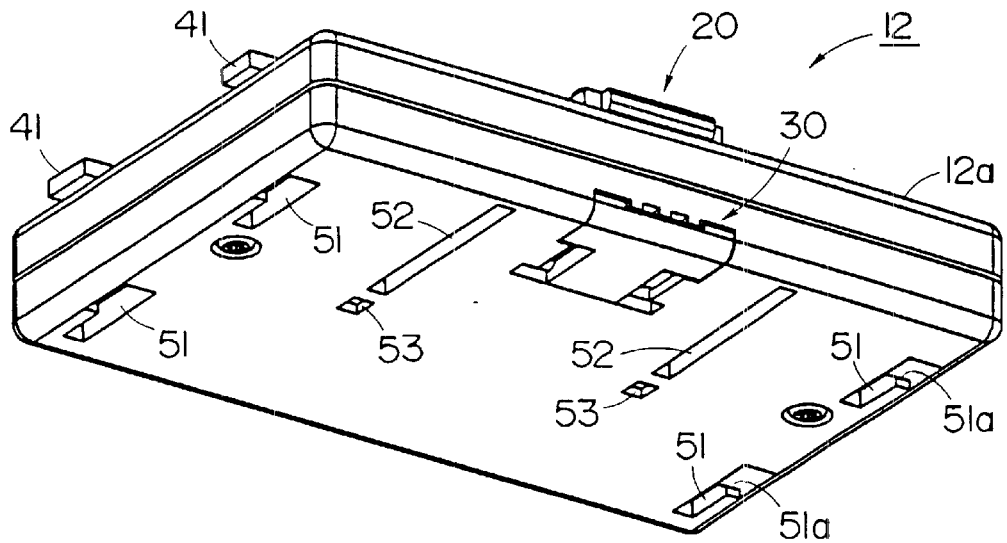
FIG. 8A is a perspective view of the USB-type connecting device of FIG. 5A.
Figure 8B:
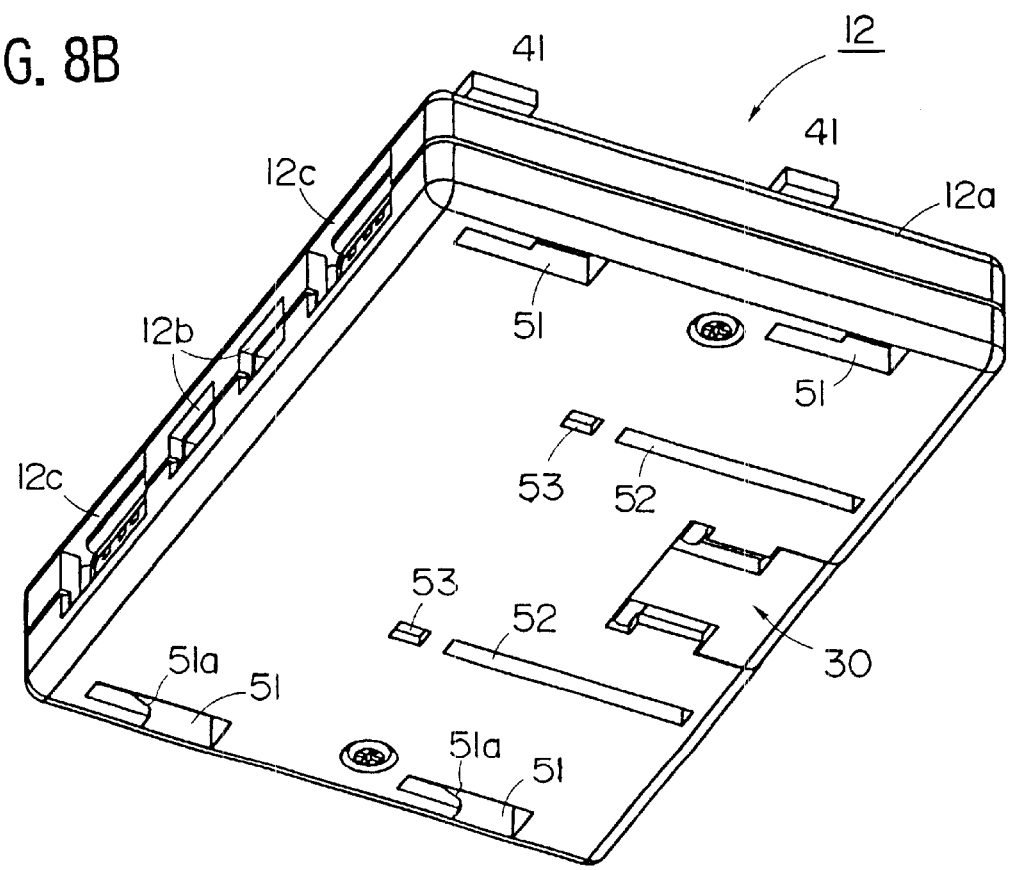
FIG. 8 is a perspective view of the USB-type connecting device of FIG. 5A.

As shown in FIGS. 5C, 8A, and 8B, the joining portion 50 is situated on the lower surface of the casing 12a, and comprises two pairs of hook holes 51 formed in both end regions, a pair of guide grooves 52 formed on both sides of the terminal unit 30, and a pair of positioning holes 53 formed on the lines extending from the guide grooves 52.

The hook holes 51 are located in the positions corresponding to the hooks 41, and extend backward and forward. The rear end of each of the hook holes 51 is wide enough to accommodate and release each corresponding hook claw 41a, while the front end is narrow enough to engage with each corresponding hook claw 41a.

On the inner side of the narrow portion of each of the hook holes 51, a sloped notch 51a is formed to facilitate the sliding of each corresponding hook claw 41a, as shown in FIGS. 8A and 8B.

The guide grooves 52 are located in the positions corresponding to the guide protrusions 42, and extend backward and forward in parallel with each other. These guide grooves 52 are integrally molded with the casing 12a.

The positioning holes 53 are located in the positions corresponding to the positioning protrusions 43.

As shown in FIGS. 6C, 7A and 7B, 9A to 9D, 11A to 11D, and 13A and 13B, the contact point unit 20 comprises a main body 21 rotatably supported with the casing 12a, a plurality (four, in the drawings) of contact points 22 formed in parallel with each other on the surface of the main body 21, a rotational axis 23 protruding from both side surfaces of the main body 21, and a rotation stopper protrusion 24.

The main body 21 is made of a plastic material, for instance. The contact points 22 are incorporated into the main body 21 by insert molding.

Figure 9A:
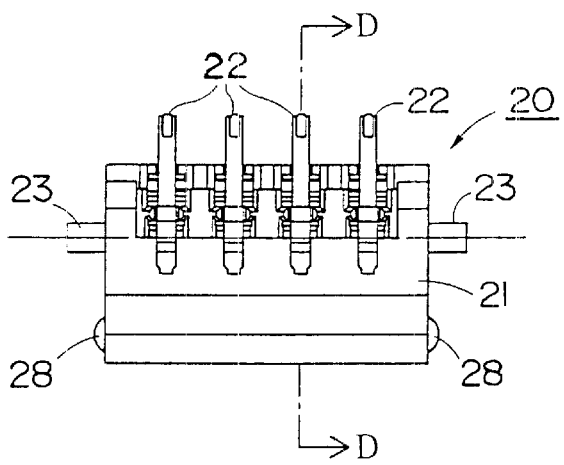
FIG. 9A is a front view of a contact point unit of the USB-type connecting device of FIG. 5A.
Figure 9B:
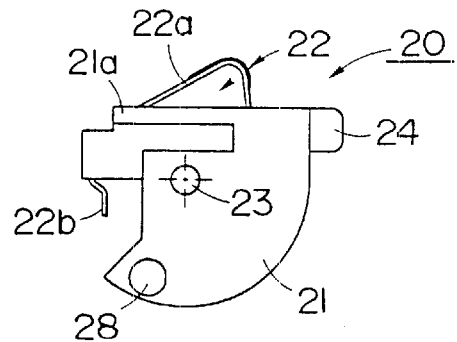
FIG. 9B is a right side view of the contact point unit of FIG. 9A.
Figure 9C:
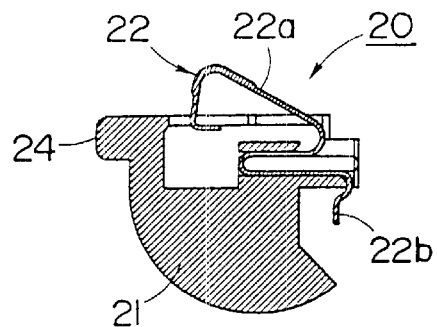
FIG. 9C is a sectional view of the contact point unit taken along the line D—D of FIG. 9A.
Figure 9D:
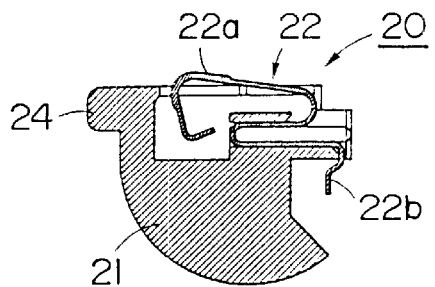
FIG. 9D is a sectional view of the contact point unit when a contact point is elastically deformed.

Each of the contact points 22 is made of a conductive elastic material. When one end 22a of each of the contact points 22 is brought into contact with each corresponding contact point of the terminal unit 30, the end 22a is elastically deformed as shown in FIG. 9D, and the other end 22b protrudes from the outer surface of the main body 21.

Figure 10:
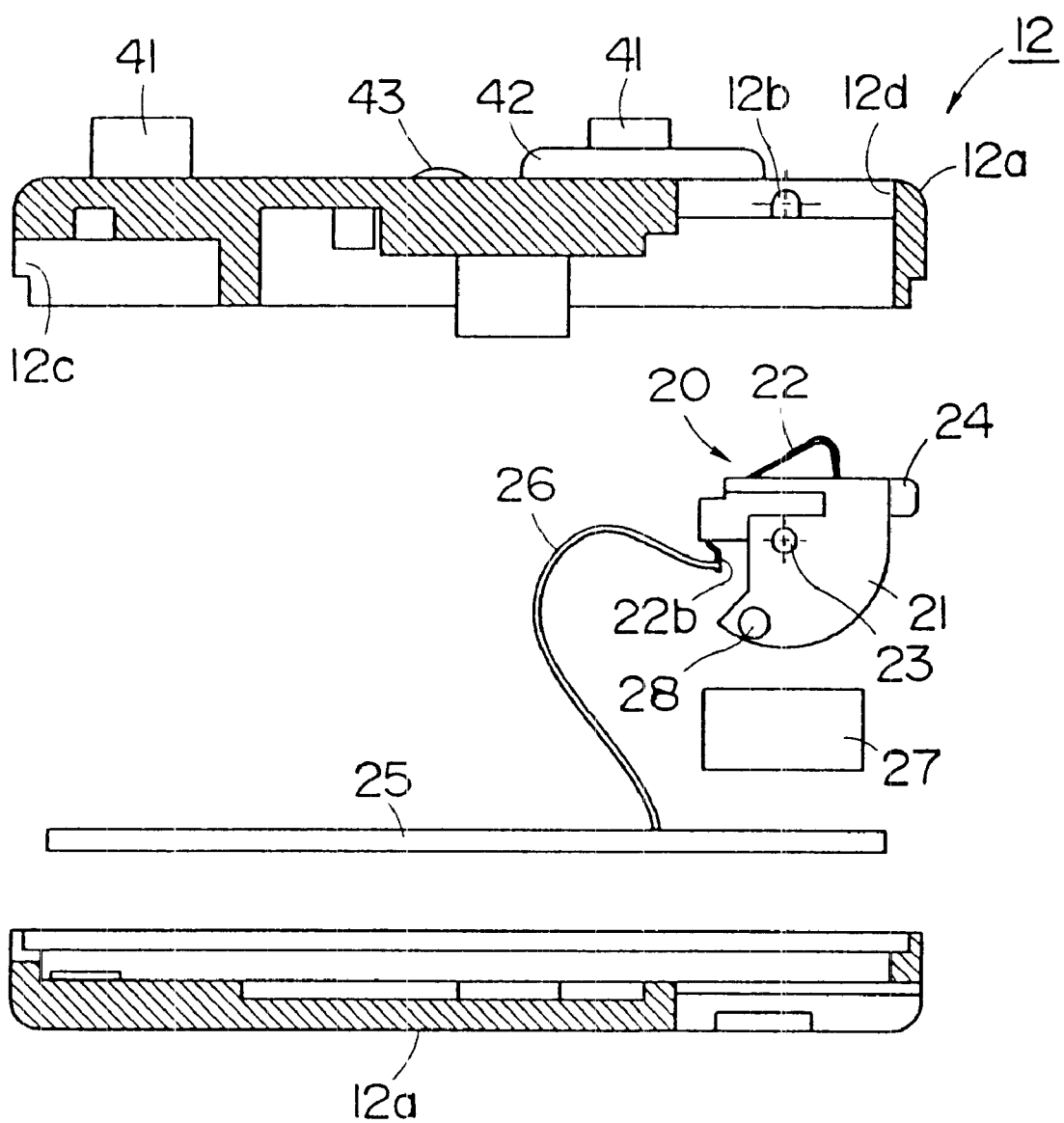
FIG. 10 illustrates the assembling process of the contact point unit of FIG. 9A.

The contact point unit 20 is assembled as shown in FIG. 10.

More specifically, the other ends 22b of the contact points 22 are electrically connected via a lead wire 26 to a connection pattern on a substrate 25 to be accommodated in the casing 12a. The rotational axis 23 is then inserted into bearings 12b formed in the casing 12a, and is held by a fixing member 27, thereby closing the casing 12. Thus, the assembling of the contact point unit 20 is completed.

Figure 11A:
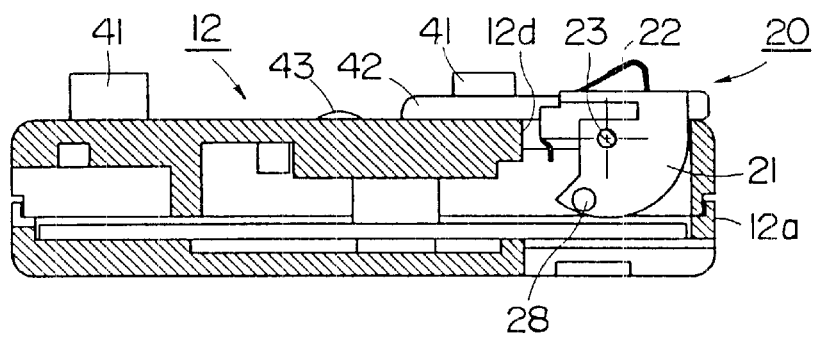
FIGS. 11A to 11D are sectional view of the contact point unit of FIG. 9A in different rotational states.
Figure 11B:
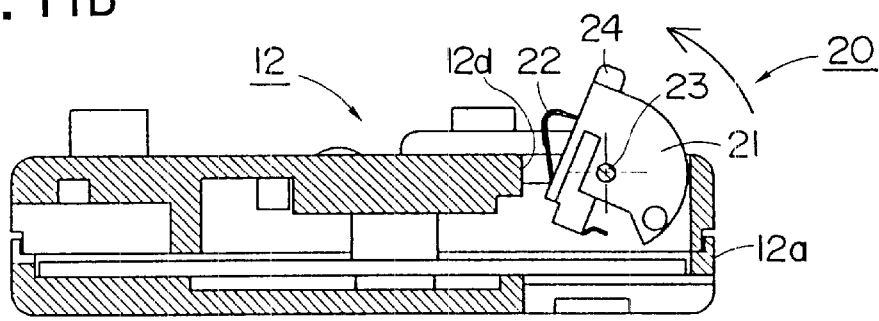
Figure 11C:
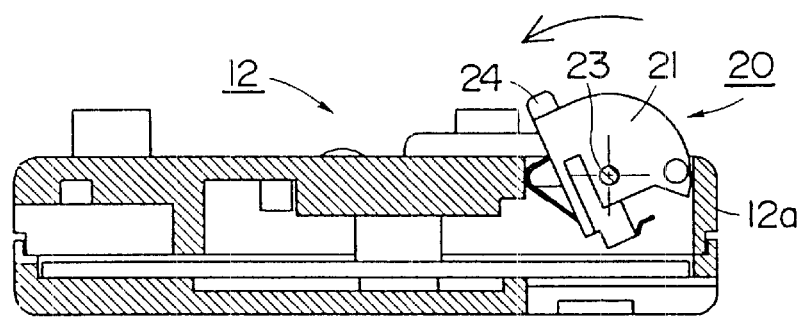
Figure 11D:
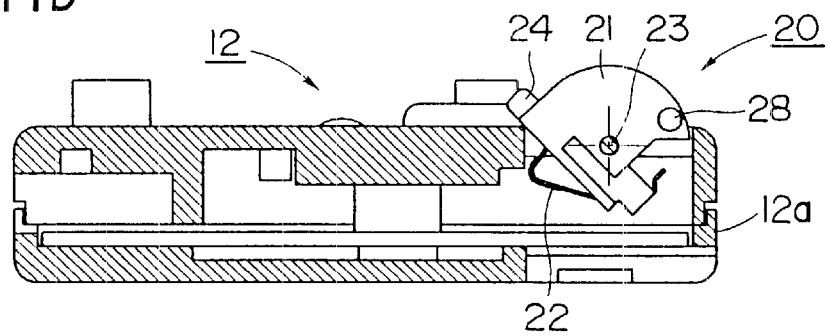
Figure 12A:
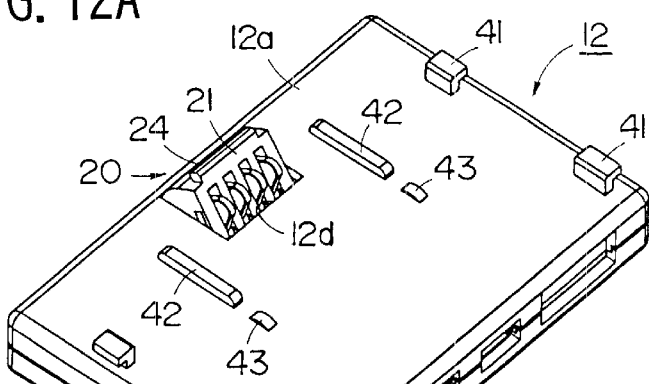
FIGS. 12A to 12C are perspective view of the contact point units of FIG. 9A in different rotational states.
Figure 12B:
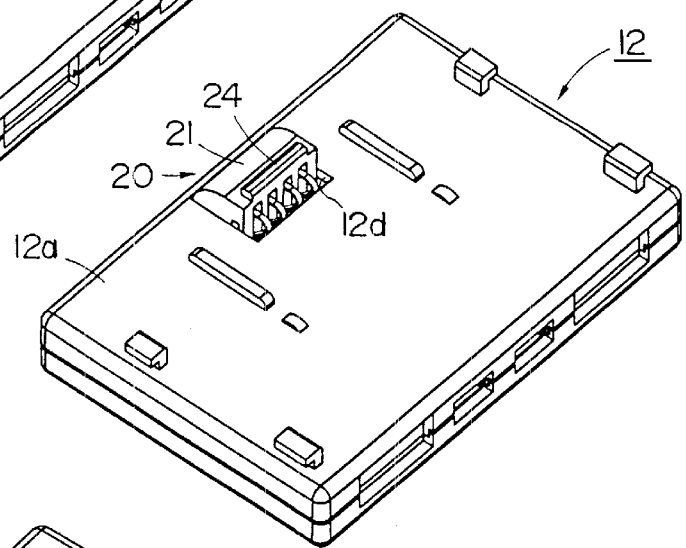
Figure 12C:
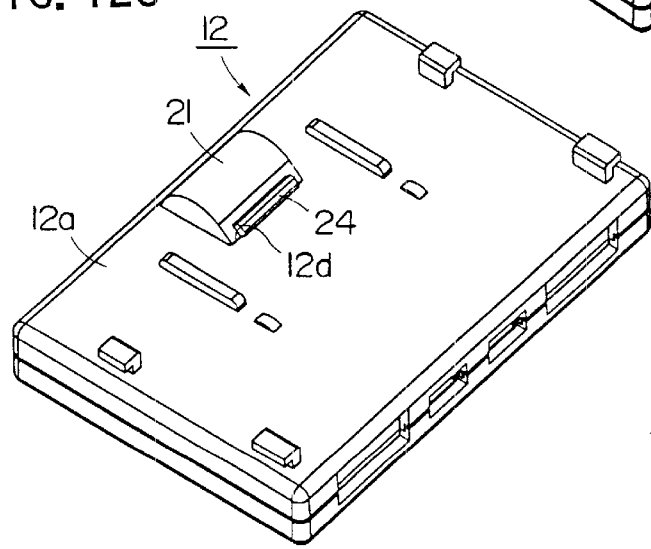
Figure 13A:
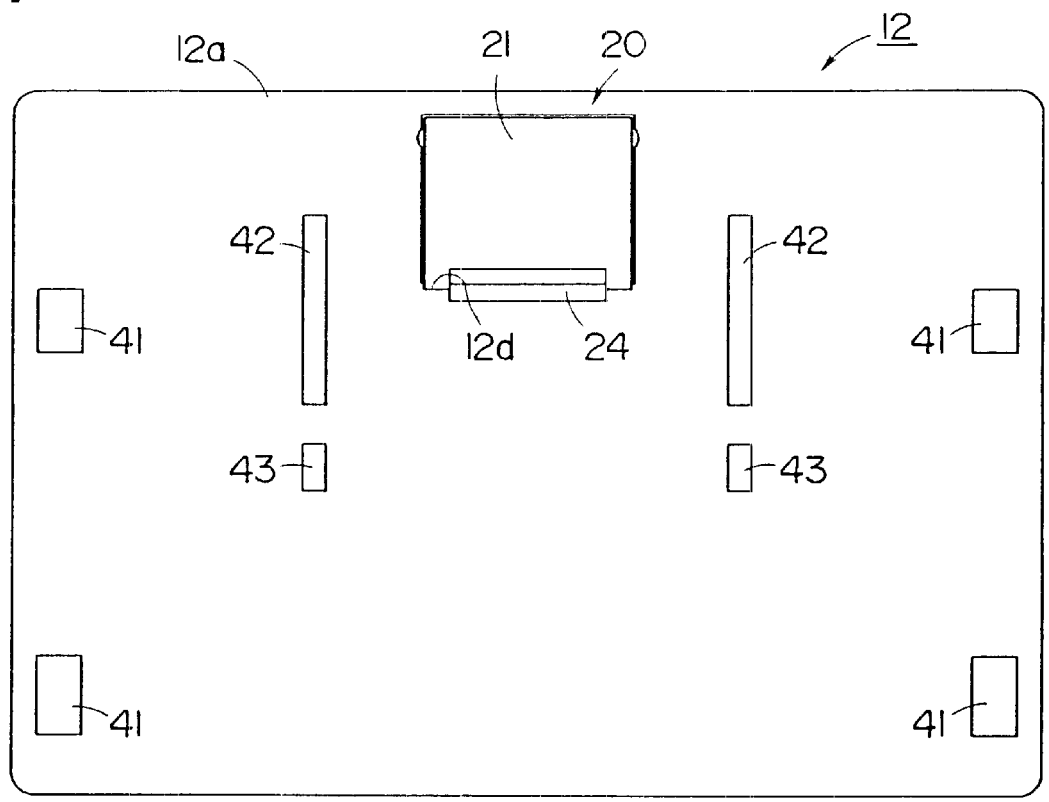
FIG. 13A is a plan view of the USB-type connecting device, with the contact points of the contact point unit being accommodated.
Figure 13B:
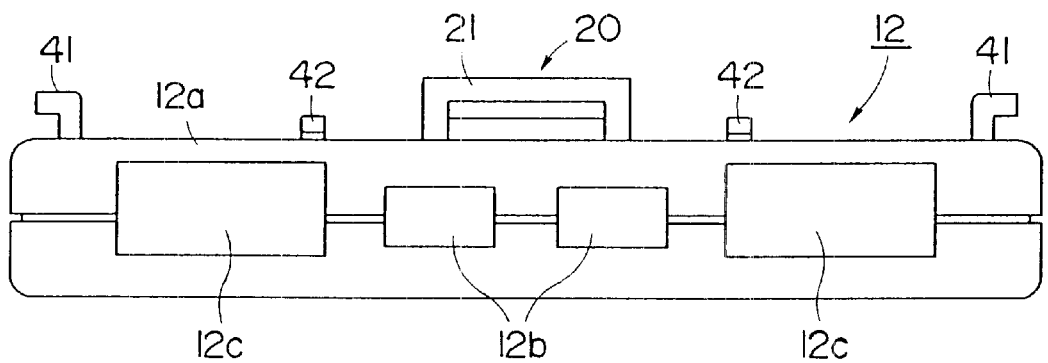
FIG. 13B is a front view of the USB-type connecting device of FIG. 13A.

In the normal state, i.e., when the contact point unit 20 is used, the contact point unit 20 is located in a position where the contacts points 22 are completely exposed through a notch 12d formed in the rear end portion of the upper surface of the casing 12a, as shown in FIGS. 7A and 7B, and FIG. 11A. The contact point unit 20 is rotated around the rotational axis 23, going through a situation shown in FIGS. 11B and 12A, and a situation shown in FIGS. 11C and 12B. Finally, the rotation stopper protrusion 24 is brought into contact with the front periphery of the notch 12d, so that the contact point unit 20 is maintained at the contact point accommodating position, as shown in FIGS. 11D, 12C, and 13A and 13B.

Small protrusions 28 formed on the side surfaces of the main body 21 are engaged with the rear periphery of the notch 12d, i.e., with the surface of the casing 12a, so that the contact point unit 20 is held in the contact point accommodating position.

The contact point unit 20 is further provided with ribs 21a on both sides of the upper surface of the main body 21.

Figure 14A:
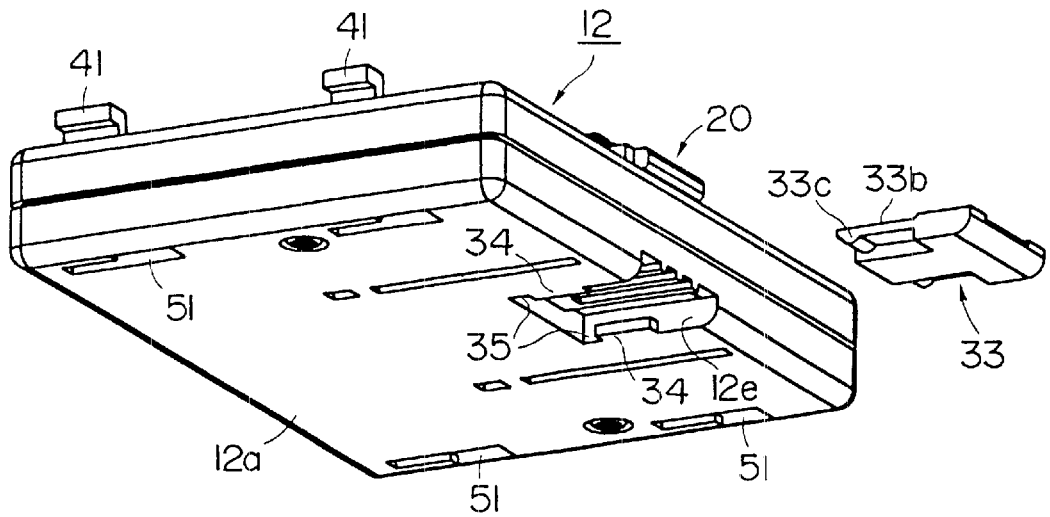
FIGS. 14A and 14B are perspective views of the USB-type connecting device of FIG. 5A, with a cover for a terminal unit being removed.
Figure 14B:
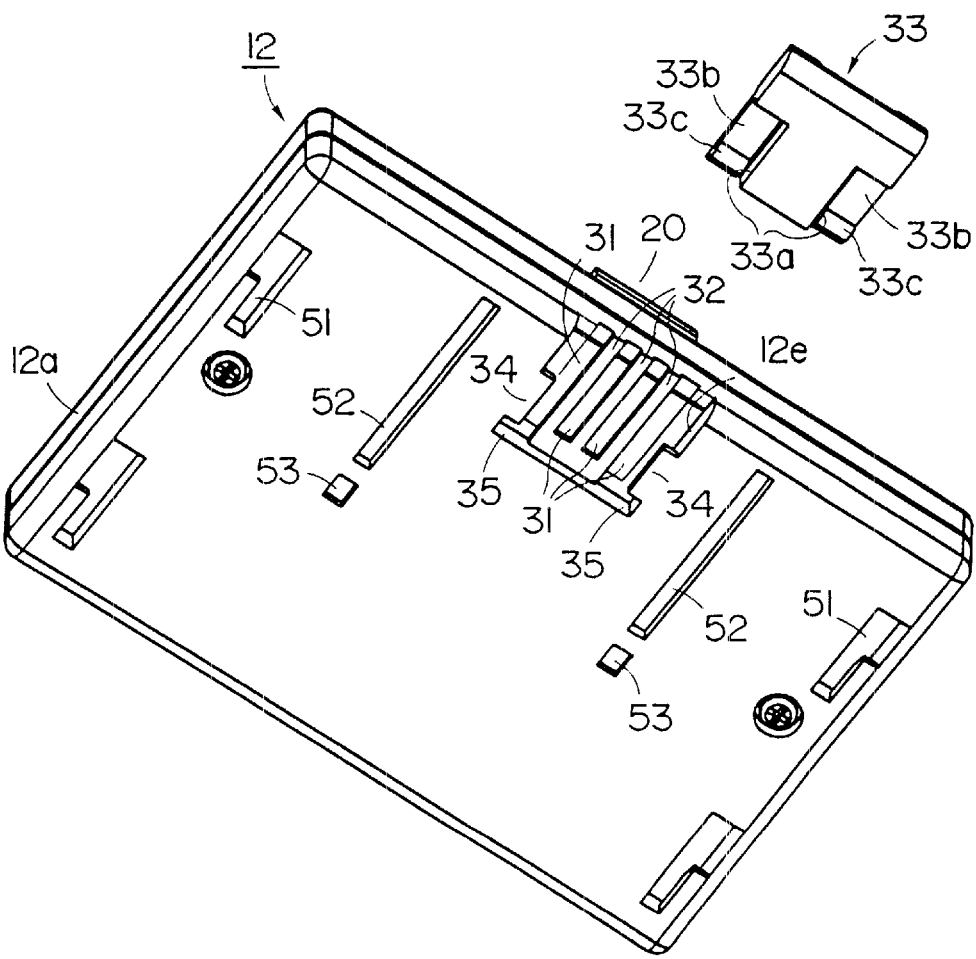
Figure 15:
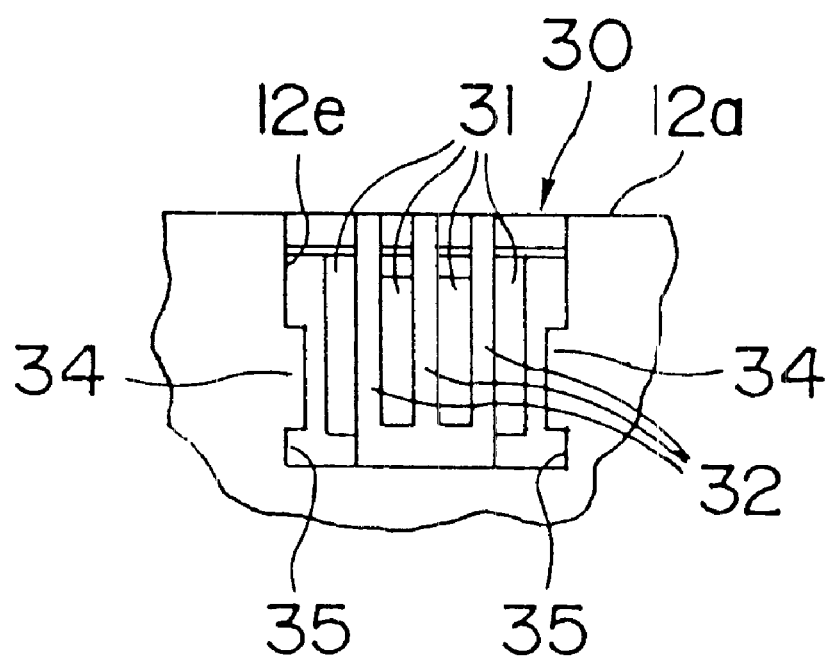
FIG. 15 is a partial bottom view of the USB-type connecting device of FIG. 5A, with the cover for the terminal unit being removed.
Figure 16A:
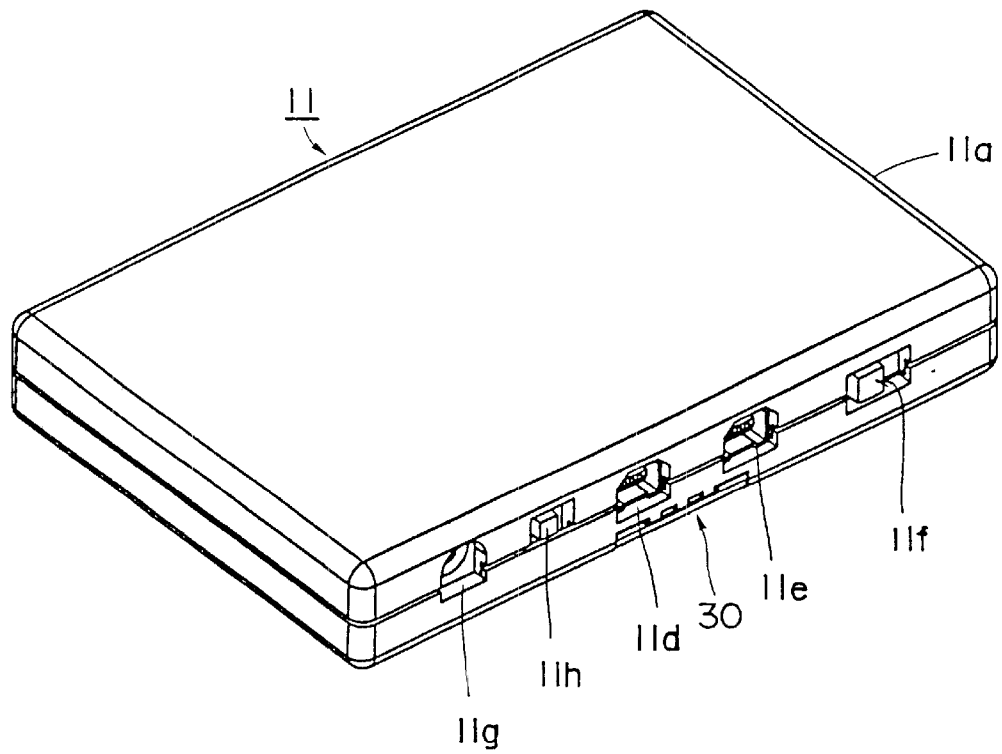
FIGS. 16A and 16B are perspective views of a USB-connecting device having a second structure in accordance with the present invention.
Figure 16B:
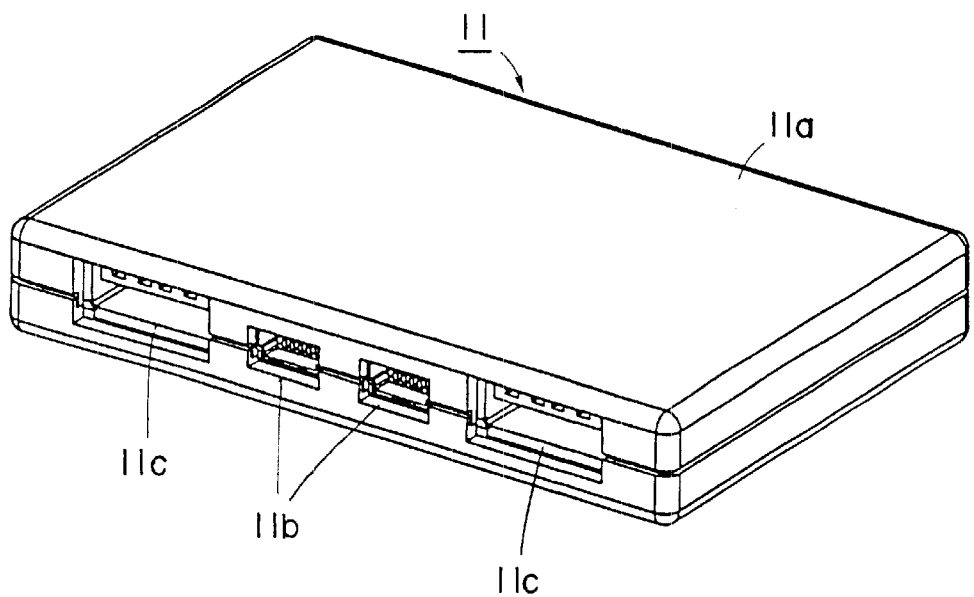
Figure 17A:
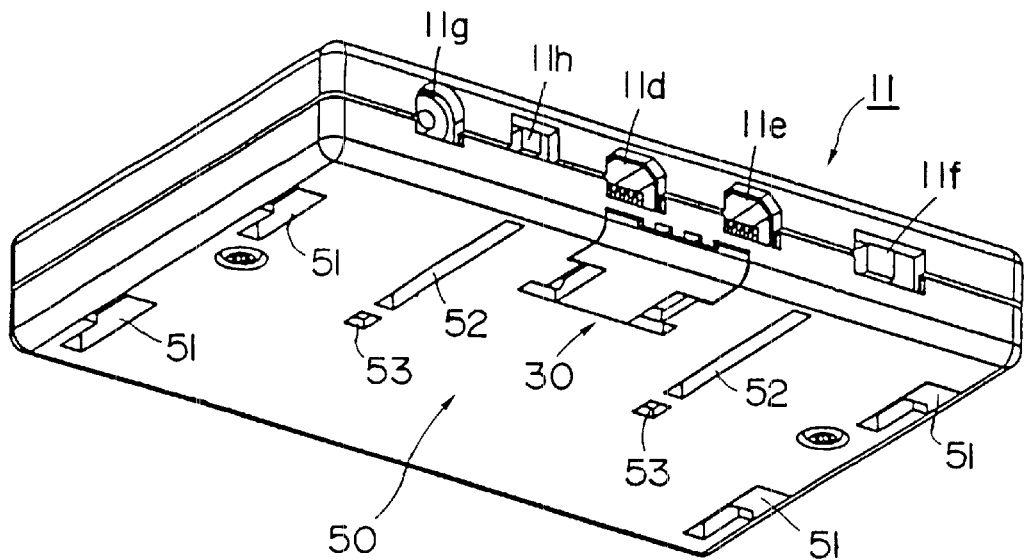
FIGS. 17A and 17B are perspective view of the USB-connecting device of FIGS. 16A and 16B.
Figure 17B:
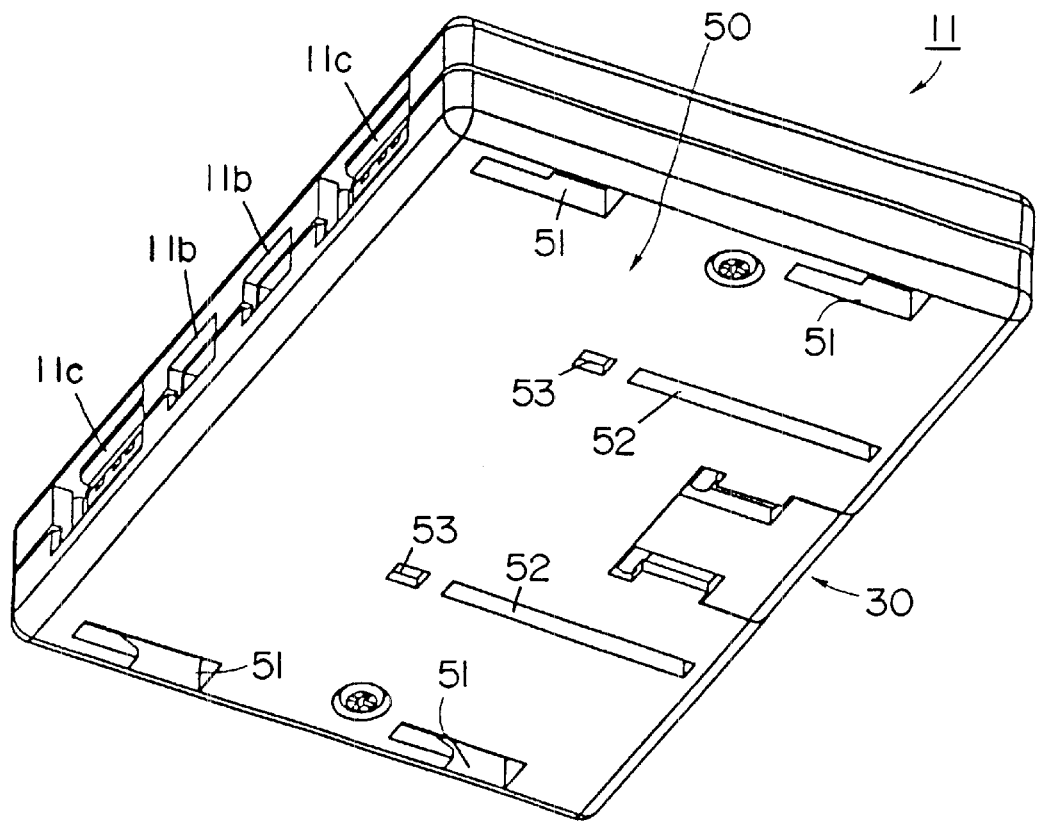
Figure 18A:
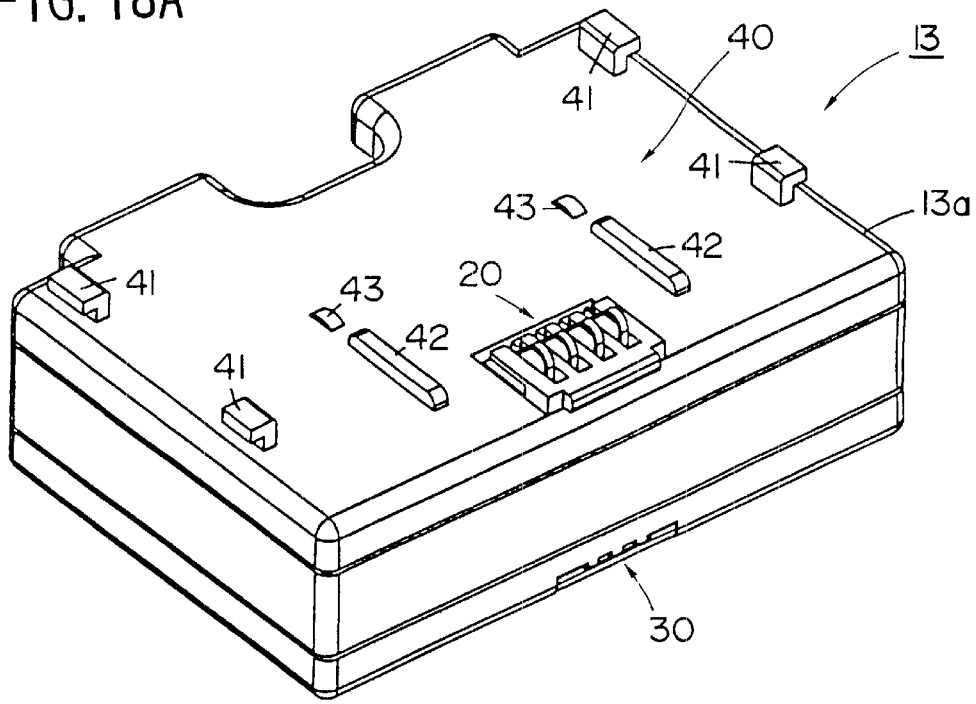
FIGS. 18A and 18B are perspective views of a second example of the USB-type connecting device having the first structure.
Figure 18B:
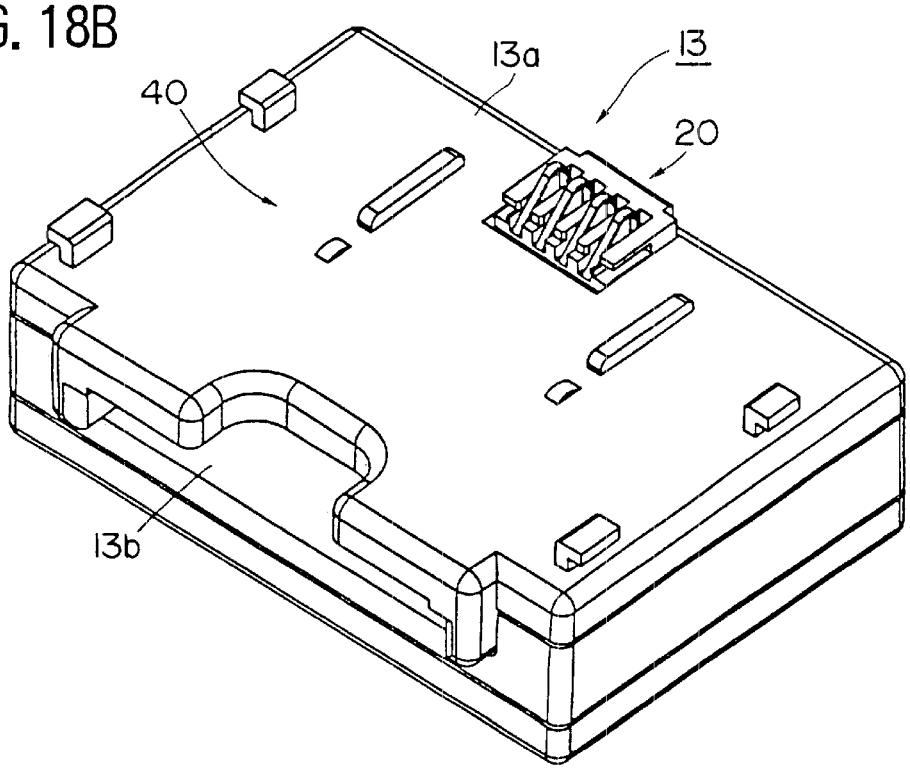
Figure 19A:
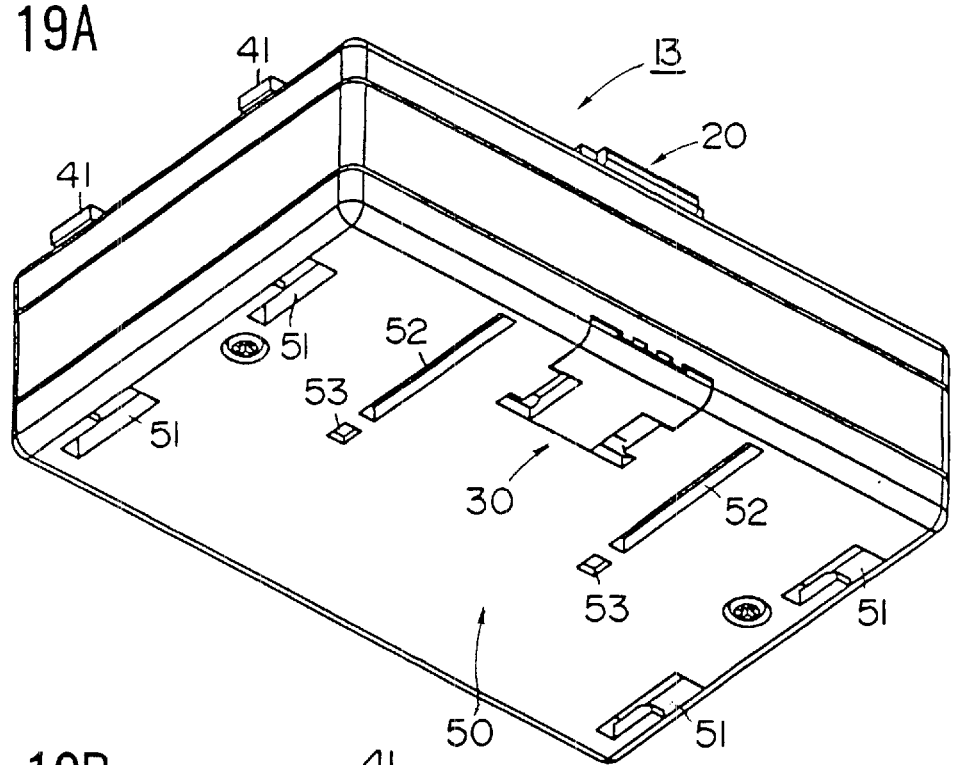
FIGS. 19A and 19B are perspective views of the USB-type connecting device of FIGS. 18A and 18B.
Figure 19B:
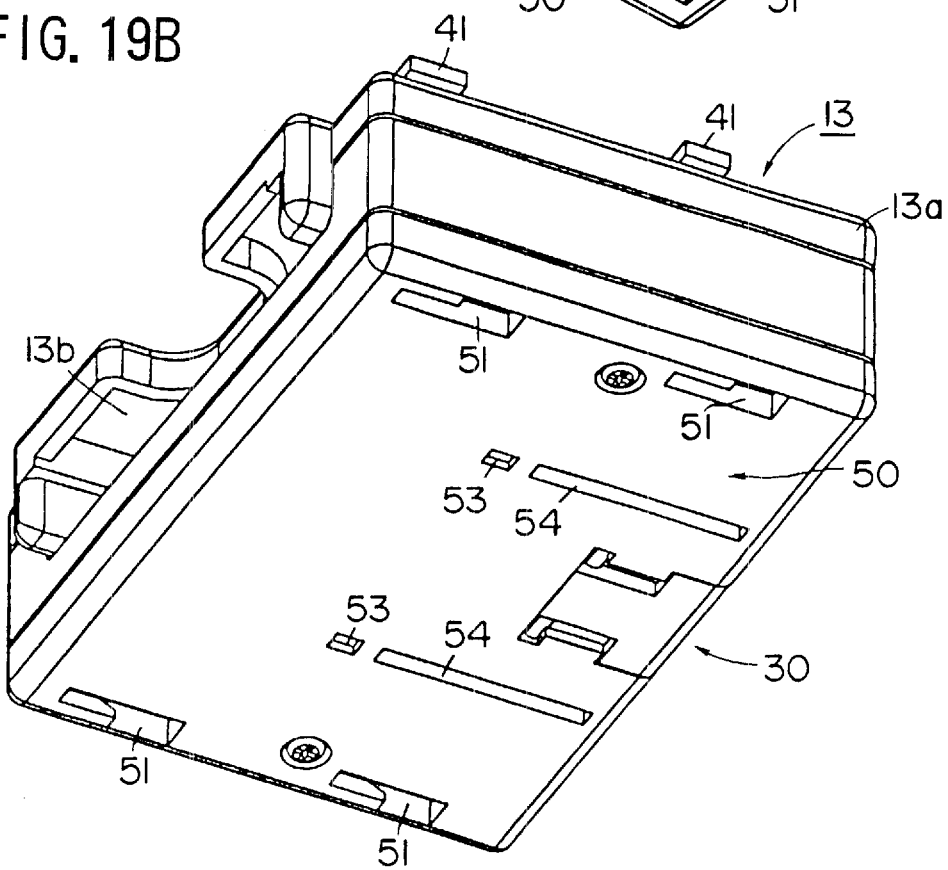

As shown in FIGS. 14A, 14B, and 15, the terminal unit 30 comprises a plurality (four, in the drawings) of terminals 31 formed by a conductive pattern on the substrate in the casing 12a, a frame 32 formed in a window 12e of the casing 12a, and a cover 33 detachably provided on the window 12e. The window 12e is to be covered with the cover 33.

Each of the terminals 31 is arranged at a distance from the lower surface of the casing 12a. The distance between each terminal 31 and the lower surface of the casing 12a is shorter than the distance between each corresponding contact point 22 and the upper surface of the casing 12a.

The frame 32 is situated between the terminals 31, and the lower surface of the frame 32 is located in a lower position than the surfaces of the terminals 31, thereby forming protruding ribs. In this configuration, the terminals 31 are effectively protected, and one cannot inadvertently touch the terminals 31.

The cover 33 comprises ribs 33b separated by slits 33a on either side of the front portion, and engaging portions 33c protruding downward.

The window 12e of the casing 12a has tang protrusions 34 protruding inward from either side of the front portion.

The tang protrusions 34 are engaged with the ribs 33b of the cover 33, thereby guiding the cover 33 in the horizontal direction. Also, when the cover 33 completely covers the window 12e, the engaging portions 33c are engaged with gaps 35 between the front end of the tang protrusions 34 and the front end of the window 12e, so that the cover 33 can be held in a predetermined position.

FIGS. 16A and 16B, and 17A and 17B illustrate the USB-type connecting device 11.

The USB-type connecting device 11 serves as the main USB hub, and comprises a flat rectangular parallelepiped casing 11a, a terminal unit 30 disposed on the lower surface of the casing 11a, and a joining portion 50 also provided on the lower surface of the casing 11a.

A chip-type USB hub circuit is mounted on a substrate (not shown) disposed in the casing 11a, and two different types of USB ports 11b and 11c are disposed on the front side surface of the casing 11a. The USB ports 11b and 11c, and the terminal unit 30 serve as the USB port for the lower layers, and are connected to the USB hub circuit.

Two USB ports 11d and 11e for the upper layers are disposed on the rear side surface of the casing 11a. These USB ports 11d and 11e can be selectively switched by a switch 11f.

A power source terminal 11g and a power switch 11h are also provided on the rear side surface of the casing 11a. Power is supplied from the outside to the power source terminal 11g, and the power source is switched on and off by the power switch 11h.

The terminal unit 30 and the joining portion 50 have the same structures as the terminal unit 30 and the joining portion 50 of the USB-type connecting device 12.

FIGS. 18A and 18B, and 19A and 19B illustrate the USB-type connecting device 13.

The USB-type connecting device 13 is a compact lash card reader as an auxiliary memory unit, and comprises a flat rectangular parallelepiped casing 13a, a contact point unit 20 provided on the upper surface of the casing 13a, a joining portion 40, a terminal unit 30 provided on the lower surface of the casing 13a, and a joining portion 50 also provided on the lower surface of the casing 13a.

The contact point unit 20 serves as the USP port for the upper layers, and is connected to a chip-type USB hub circuit mounted on a substrate (not shown) disposed in the casing 13a.

An insertion slot 13b for accommodating a compact flash card is formed on the front side of the casing 13a, and a connector to be connected to a connector unit of a compact flash card and a control circuit (not shown) are mounted on the substrate deep inside the insertion slot 13b.

The control circuit and the terminal unit 30 serves as the USB port for the lower layers, and are also connected to the USB hub circuit.

The contact point unit 20, the terminal unit 30, and the joining portions 40 and 50 of the USB-type connecting device 13 are the same as the contact point unit 20, the terminal unit 30, and the joining portions 40 and 50 of the USB-type connecting device 12.

Figure 20A:
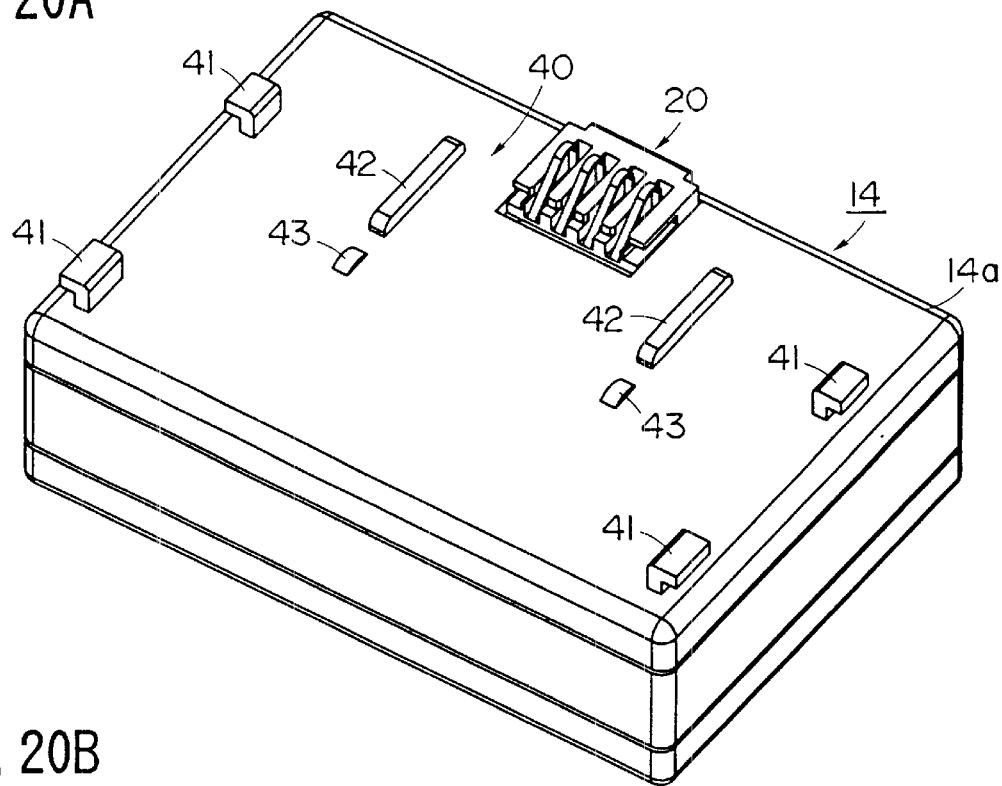
FIGS. 20A and 20B are perspective views of a third example of the USB-type connecting device having the first structure.
Figure 20B:
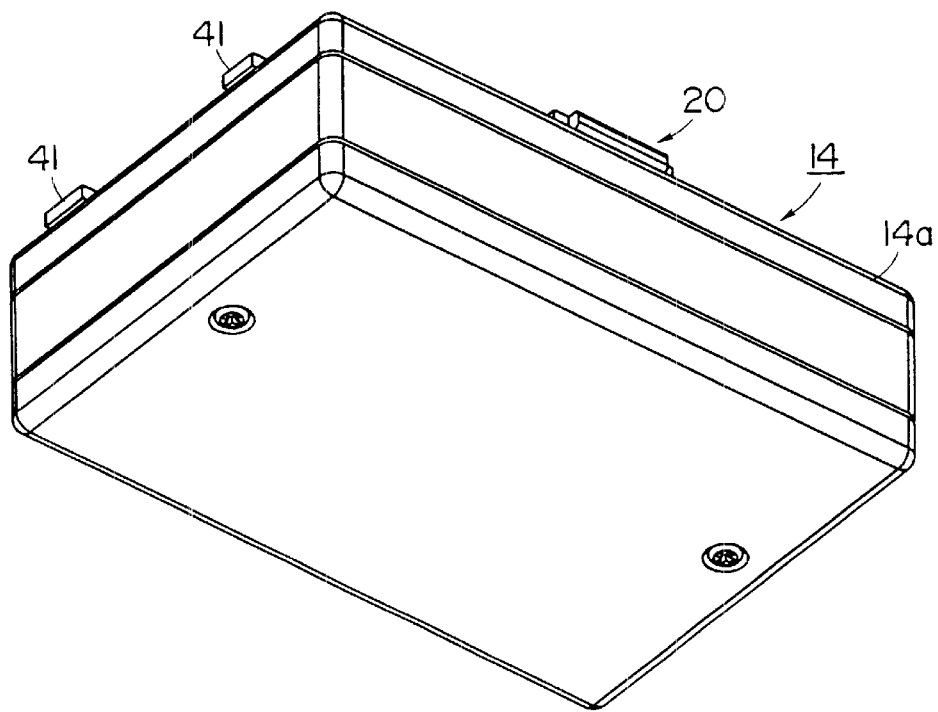
Figure 21A:
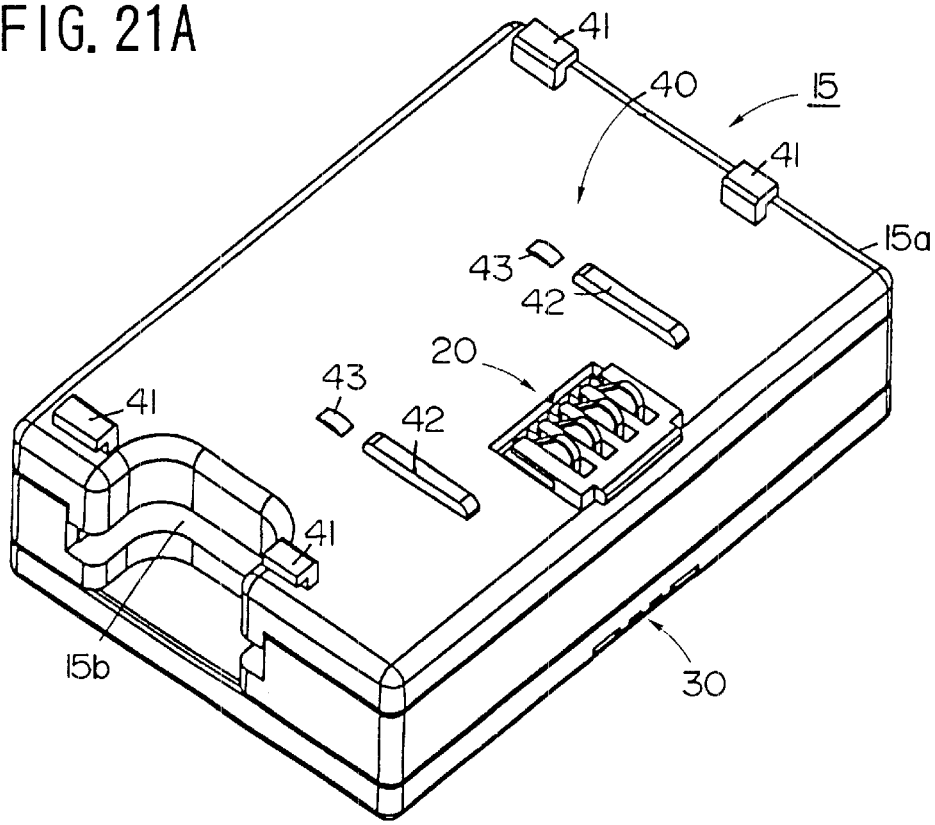
FIGS. 21A and 21B are perspective views of a second example of the USB-type connecting device having the second structure.
Figure 21B:
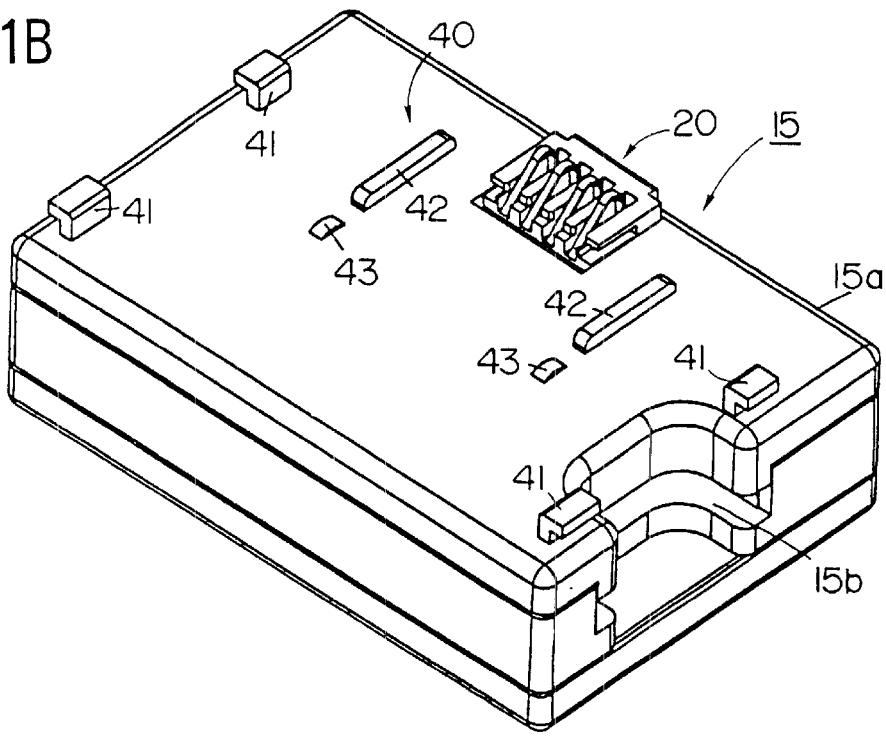
Figure 22A:
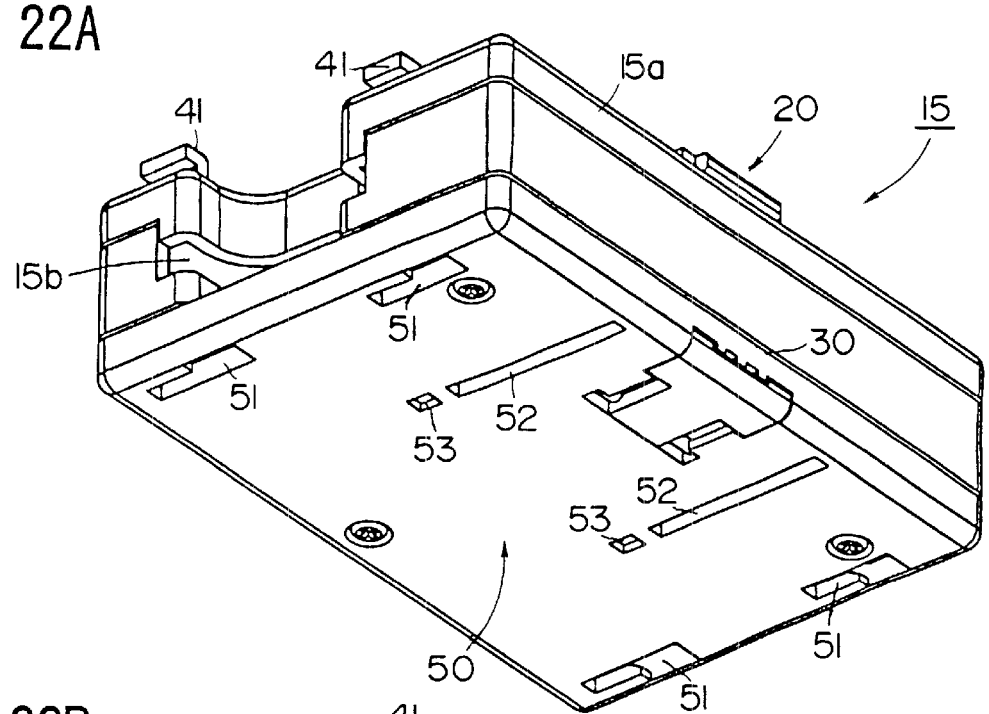
FIGS. 22A and 22B are perspective views of the USB-type connecting device of FIGS. 21A and 21B.
Figure 22B:
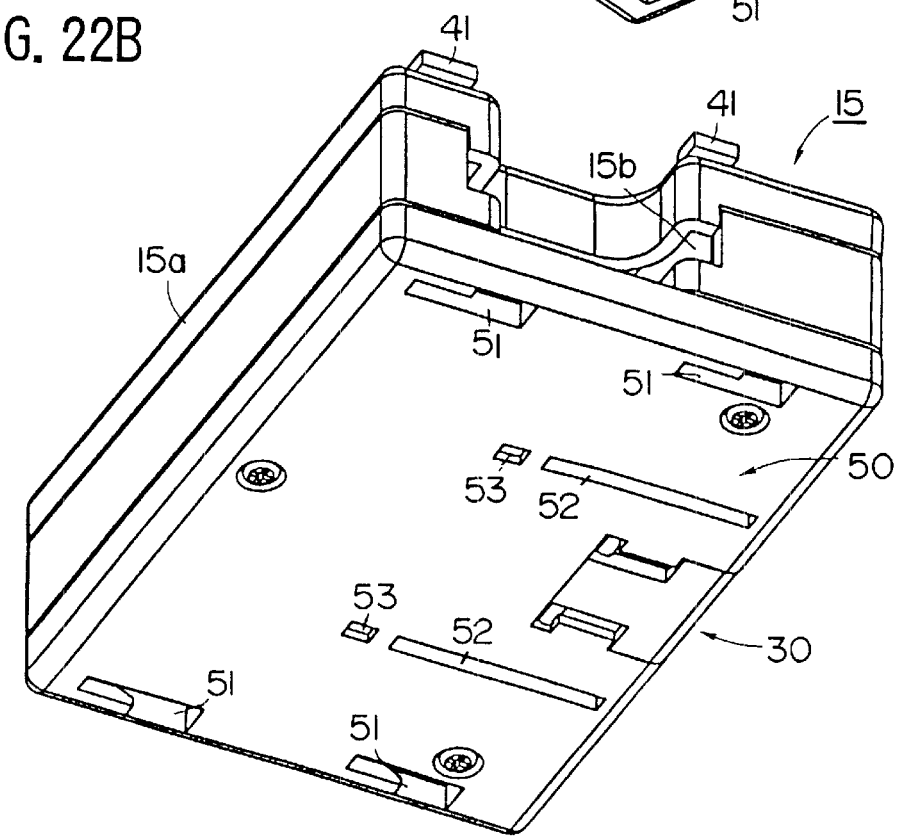
Figure 23A:
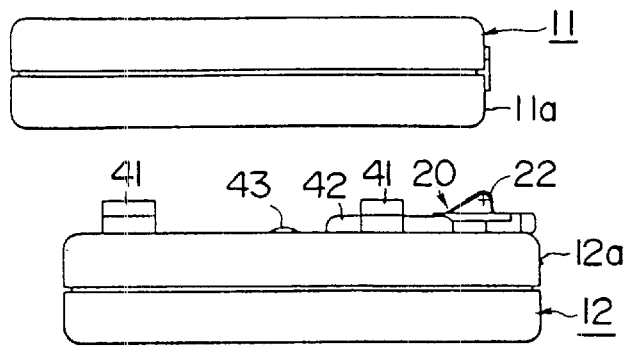
FIG. 23A is a right side view of the USB-type connecting device of FIG. 5A and the USB-type connecting device of FIG. 16A to be brought into contact with each other.
Figure 23B:
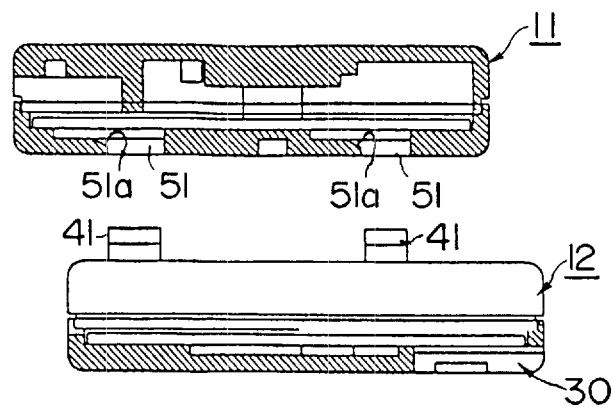
FIG. 23B is a sectional view of the USB-type connecting devices of FIG. 23A taken along hook holes.
Figure 23C:
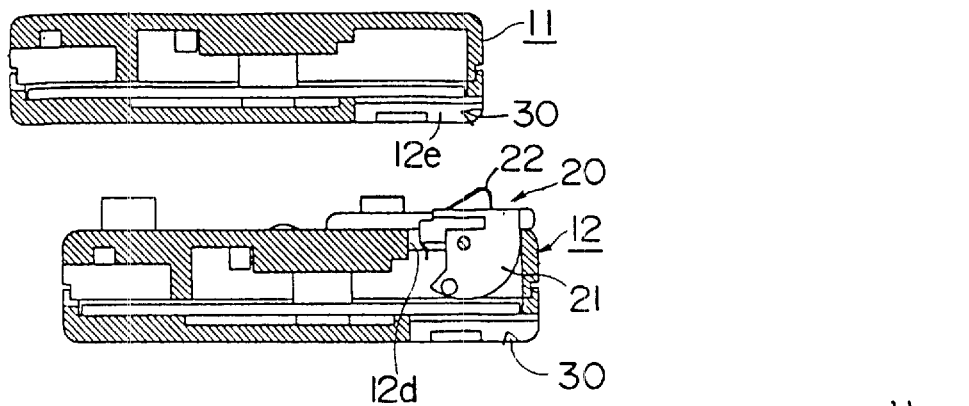
FIG. 23C is a sectional view of the USB-type connecting devices of FIG. 23A taken along the terminal unit.
Figure 23D:
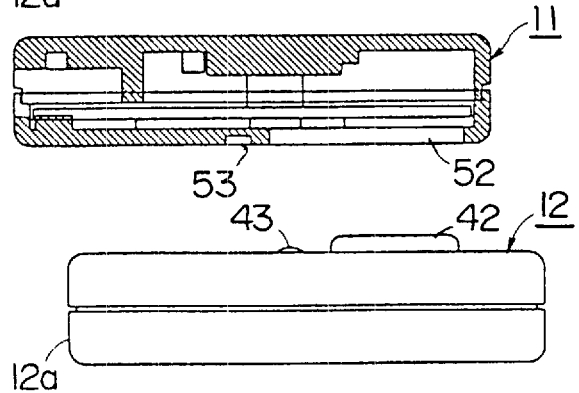
FIG. 23D is a sectional view of the USB-type connecting devices of FIG. 23A taken along guide grooves.

FIGS. 20A and 20B illustrate the USB-type connecting device 14. This USB-type connecting device 14 serves as a power source device for power supply for USB interfaces, and comprises a flat rectangular parallelepiped casing 14a, a contact point unit 20, a joining portion 40, and a power battery and a power circuit (not shown) disposed inside the casing 14a.

The contact point unit 20 and the joining portion 40 of the USB-type connecting device 14 have the same structures as the contact point unit 20 and the joining portion 40 of the USB-type connecting device 12.

FIGS. 21A, 21B, 22A, and 22B illustrate a modification of the USB-type connecting device 13 shown in FIGS. 18A, 18B, 19A, and 19B.

As shown in FIGS. 21A, 21B, 22A, and 22B, a USB-type connecting device 15 is a memory stick reader as an auxiliary memory unit, and comprises a flat rectangular parallelepiped casing 15a, a contact point unit 20 disposed on the upper surface of the casing 15a, a joining portion 40, a terminal unit 30 disposed on the lower surface of the casing 15a, and a joining portion 50 also provided on the lower surface of the casing 15a.

The contact point unit 20 serves as the USB port for the upper layers, and is connected to a chip-type USB hub circuit mounted on a substrate (not shown) disposed inside the casing 15a.

On the right side surface of the casing 15a, an insertion slot 15b for a memory stick is formed. Deep inside the insertion slot 15b, a connector to be connected to a connector unit of a memory stick and a control circuit (not shown) are mounted on the substrate.

The control circuit and the terminal unit 30 serve as the USB port for the lower layers, and are connected to the USB hub circuit.

The contact point unit 20, the terminal unit 30, and the joining units 40 and 50 of this modification have the same structures as the contact point unit 20, the terminal unit 30, and the joining units 40 and 50 of the USB-type connecting device 12.

The USB-type connecting system 10 provided with the contact point unit 20 of the present invention is structured as described so far. When the USB-type connecting system 10 is actually used, the USB-type connecting devices 11, 12, 13, and 14 are laminated on one another, and the laminated state is maintained as shown in FIG. 3.

In the following, a case where the USB-type connecting devices 11 and 12 are combined will be described.

As shown in FIGS. 23A to 23D, the upper USB-type connecting device 11 is positioned at a slightly forward location with respect to the lower USB-type connecting device 12. Here, the wider portion of each hook hole 51 formed on the lower surface of the casing 11a of the upper USB-type connecting device 11 faces each corresponding hook 41 formed on the upper surface of the casing 12a of the lower USB-type connecting device 12.

Figure 24A:
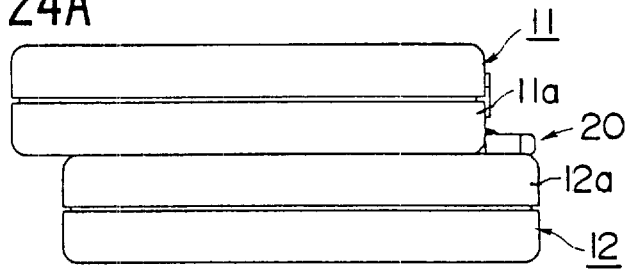
FIG. 24A is a right side view of the USB-type connecting device FIG. 5A and the USB-type connecting device of FIG. 16A in contact with each other.

As shown in FIG. 24A, the upper USB-type connecting device 11 is then moved downward, so that the lower surface of the casing 11a of the USB-type connecting device 11 is brought into contact with the upper surface of the casing 12a of the USB-type connecting device 12.

Figure 24B:
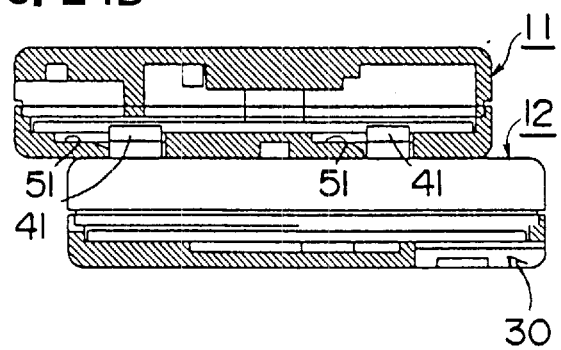
FIG. 24B is a sectional view of the USB-type connecting devices of FIG. 24A taken along the hook holes.
Figure 24C:
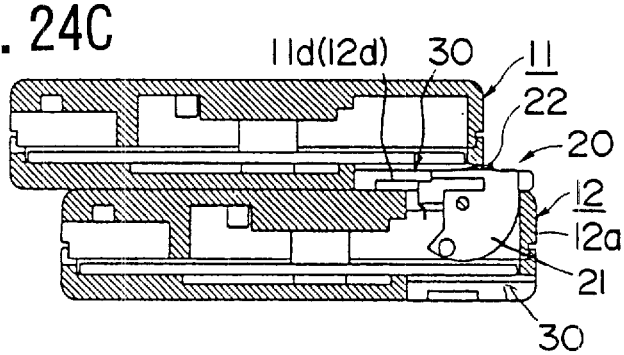
FIG. 24C is a sectional view of the USB-type connecting devices of FIG. 24A taken along the terminal unit.
Figure 24D:
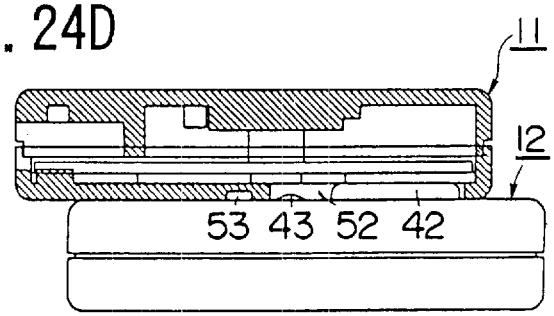
FIG. 24D is a sectional view of the USB-type connecting devices of FIG. 24A taken along the guide grooves.
Figure 25A:
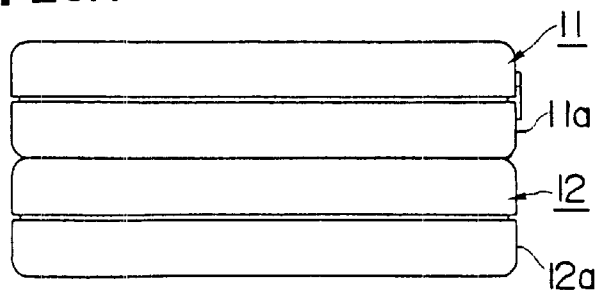
FIG. 25A is a right side view of the USB-type connecting device of FIG. 5A and the USB-type connecting device of FIG. 16A combined together.
Figure 25B:
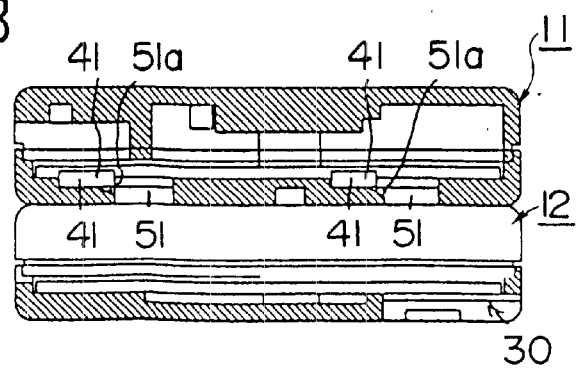
FIG. 25B is a sectional view of the USB-type connecting devices of FIG. 25A taken along the hook holes.
Figure 25C:
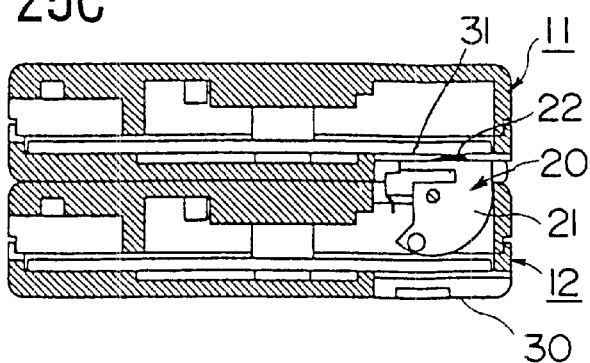
FIG. 25C is a sectional view of the USB-type connecting devices of FIG. 25A taken along the terminal unit.

The hooks 41 of the USB-type connecting device 12 are then inserted into the wider portions of the hook holes 51 of the USB-type connecting device 11, as shown in FIG. 24B. At the same time, the guide protrusions 42 of the USB-type connecting device 12 are inserted into the guide grooves 52 of the USB-type connecting device 11, as shown in FIG. 24C. Furthermore, the main body 21 and the contact points 22 of the contact point unit 20 protruding from the upper surface of the casing 12a of the USB-type connecting device 12 enter the casing 11a of the USB-type connecting device 11 through the window 11d formed on the lower surface of the casing 11a, as shown in FIG. 25C. Here, the contact points 22 are in contact with the respective terminals 31, and are pressed downward. As a result, the contact points 22 are elastically deformed, as shown in FIG. 9D.

The USB-type connecting device 11 is then moved backward with respect to the USB-type connecting device 12, so that the casing 11a and the casing 12a are aligned.

As the guide protrusions 52 are engaged with the guide grooves 42, the casing 11a of the USB-type connecting device 11 can be prevented from being deviated in the transverse direction. The hooks 41 of the USB-type connecting device 12 move in the hook holes 51 of the USB-type connecting device 11, so that the hook claws 41a of the hooks 41 slide along the sloped notches 51a of the hook holes 51, and are smoothly engaged with the narrow portions of the hook holes 51. Thus, the casing 11a and the casing 12a are secured to each other.

Figure 25D:
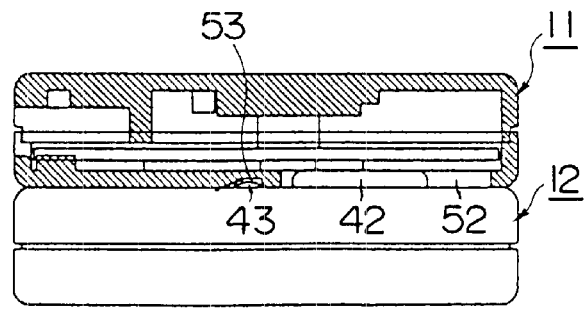
FIG. 25D is a sectional view of the USB-type connecting devices of FIG. 25A taken along the guide grooves.

Further, the positioning protrusions 43 of the USB-type connecting device 12 enter the positioning holes 53 of the USB-type connecting device 11, so that the casing 11a and the casing 12a are semi-locked to each other, and are engaged with each other in the backward and forward directions, as shown in FIG. 25D.

The ribs 21a on both sides of the main body 21 are engaged with the tang protrusions 34 protruding inward from the window of the terminal unit 30 of the USB-type connecting device 11. As a result, the contact point unit 20 of the USB-type connecting device 12 is positioned to the terminal unit 30 of the USB-type connecting device 11 in the transverse direction (see FIGS. 7A, 7B, 8A, 8B, 14A, and 14B).

In the above manner, the assembling of the USB-type connecting device 11 and the USB-type connecting device 12 is completed.

The USB-type connecting devices 12, 13, and 14 are assembled in the same manner, thereby forming the USB connecting system 10 comprising the USB-type connecting devices 11, 12, 13, and 14, as shown in FIG. 3.

In the USB-type connecting system 10 having the above structure, personal computers can be connected to the USB ports 11d and 11e of the upper layers of the USB-type connecting device 11 as the main USB hub via a USB cable. Also, a USB hub and various peripheral equipments, such as keyboard, mouse, printer, and scanner, can be connected to the USB ports 11b, 11c, 12b, and 12c of the lower layers of the USB-type connecting devices 11 and 12. Accordingly, those various peripheral equipments can be used from the personal computers via USB interfaces.

In this USB-type connecting system 10, no USB cables are used between the USB-type connecting devices 11, 12, 13, and 14, which are electrically connected to one another by means of the contact point units 20 and the terminals units 30. Since no USB cables and no space for connection using USB cables are required, the structure is simplified, and the space for connection can be minimized.

The USB ports 11d and 11e of the USB-type connecting device 11 can be switched by the switch 11f. In other words, the two personal computers connected to the USB ports 11d and 11e are switched by the switch 11f, so that the various peripheral equipments connected by the USB-connecting system 10 can be selectively used through both two personal computers.

When more peripheral equipments are used in the USB-connecting system 10, the power supply from the personal computers might become insufficient. In such a case, the power battery contained in the USB-type connecting device 14 supplies sufficient power to the peripheral equipments connected to the USB-connecting system 10.

In the USB-type connecting system 10 shown in FIG. 3, it is possible to replace the USB-type connecting device 13 with the USB-type connecting device 15 that serves as a memory stick reader shown in FIGS. 20A, 20B, 21A, and 21B. It is also possible to interpose the USB-type connecting device 15 between the USB-type connecting devices 13 and 14, or the USB-type connecting devices 12 and 13.

With the USB-type connecting devices 11 to 15 of the present invention, the USB-connecting system 10 can be made up of a suitable combination of the USB-type connecting devices 11 to 15. The USB-connecting system 10 can be USB-connected to personal computers via the USB-connecting device 11, so that the peripheral equipments can be used through the personal computers. Also, since the USB-connection among the USB-connecting devices 11 to does not require USB cables, there is no need for the space for USB cables, and the wiring arrangement can be simplified.

When the contact point unit 20 is not used, the main body 21 is rotatively moved around the rotational axis 23, so that the contact point unit 20 is carried to the contact point accommodating position. Accordingly, the contact points 22 will not be exposed, and will be well protected.

Meanwhile, the frame 32 formed from a part of the casing is provided between the terminals 31, so that no one will inadvertently touch the terminals 31. Also, the cover 33 completely covers the window so as to protect the terminals 31. With this structure, the terminals 31 can be prevented from corroding due to an inadvertent touch, and the peripheral equipment can be prevented from breaking down due to static electricity generated from a finger.

In the above described embodiments, the peripheral equipments to be connected to the USB ports 11b, 11c, 12c, and 12b include keyboard, mouse, printer, and scanner. However, it should be apparent that USB-type terminal adapter, CD-R (recordable compact disk) drives, or music instruments can be connected to those USB ports.

In the above embodiments, two types of USB ports 11b, 11c, 12b, 12c are provided to the USB-type connecting deices 11 and 12, but only one of the two types will be sufficient.

No USB ports are provided for the USB-type connecting devices 13, 14, and 15, but one or more USB ports may be provided to each USB-type connecting device.

It should be understood that the present invention can be applied to electronic devices having different structures from the USB-type connecting system 10 described in this specification.

The present invention is not limited to the specifically disclosed embodiments and variations, and modifications may be made without departing from the scope of the present invention.

What is claimed is:

1. An electronic device comprising
a casing having a substrate disposed therein and a window formed on a surface thereof;
a terminal unit that is formed on the substrate, and comprises one or more terminals exposed through the window, wherein the window comprises a tang protrusions defining a space; and
a cover that is detachably mounted to the window to cover and protect the window, the cover comprising a ribs that corresponds to the tang protrusion and the rib being inserted into the space defined by the tang protrusions when the cover is detachably mounted to the window in the horizontal direction, wherein a flat exterior surface is provided to the casing by the cover mounted to the window.

2. The electronic device as claimed in claim 1, wherein:
the cover is provided with ribs formed by slits on both sides;
the window is provided with tongues protruding inwardly from both sides; and
when the cover is attached to the window, the ribs are engaged with the tongues so that the cover is secured to the window.

3. The electronic device as claimed in claim 1, wherein a frame for separating the terminals from each other is disposed between the terminals.

4. The electronic device as claimed in claim 3, wherein the frame is collectively formed with the casing.

5. An electronic device comprising:
a casing having a substrate disposed therein and a window formed on a surface thereof;

a terminal unit that is formed on the substrate, and comprises one or more terminals exposed through the window; and a cover that is detachably mounted to the window, and covers and protects the window, wherein the cover is provided with ribs formed by slits on both sides; the window is provided with tongues protruding inwardly from both sides; and when the cover is attached to the window, the ribs are engaged with the tongues so that the cover is secured to the window, and further wherein each of the ribs is slightly shorter than each corresponding side of the window; each of the ribs is provided with a stopper protrusion on a top end thereof; and when the cover is attached to the window, the stopper protrusions are engaged with gaps between peripheries of the respective tongues and a periphery of the window, so that the cover is secured to the window.

\* \* \* \* \*